United States Patent
Tagami et al.

(10) Patent No.: US 10,115,622 B2
(45) Date of Patent: Oct. 30, 2018

(54) WAFER PROCESSING LAMINATE AND METHOD FOR PROCESSING WAFER

(71) Applicant: SHIN-ETSU CHEMICAL CO., LTD., Tokyo (JP)

(72) Inventors: Shohei Tagami, Annaka (JP); Michihiro Sugo, Takasaki (JP); Hideto Kato, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/352,002

(22) Filed: Nov. 15, 2016

(65) Prior Publication Data

US 2017/0154801 A1 Jun. 1, 2017

(30) Foreign Application Priority Data

Nov. 27, 2015 (JP) .................................. 2015-231309

(51) Int. Cl.
*H01L 21/304* (2006.01)
*H01L 21/683* (2006.01)
(Continued)

(52) U.S. Cl.
CPC ........ *H01L 21/6836* (2013.01); *C09J 183/04* (2013.01); *C09J 183/10* (2013.01);
(Continued)

(58) Field of Classification Search
CPC ............. H01L 21/6835; H01L 21/6836; H01L 2221/68327; H01L 2221/6834; H01L 2221/68381; H01L 2221/68386
See application file for complete search history.

(56) References Cited

U.S. PATENT DOCUMENTS 7,541,264 B2 6/2009 Gardner et al.
9,346,990 B2 * 5/2016 Yasuda ................ C09J 153/025
(Continued)

FOREIGN PATENT DOCUMENTS

EP 2955211 A1 12/2015
JP 2004-064040 A 2/2004
(Continued)

OTHER PUBLICATIONS

Apr. 12, 2017 Search Report issued in European Patent Application No. EP16002522.7.

*Primary Examiner* — Mary Wilczewski
(74) *Attorney, Agent, or Firm* — Oliff PLC

(57) ABSTRACT

A wafer processing laminate including support, temporary adhesive material layer laminated on the support, and wafer stacked on temporary adhesive material layer, wafer having front surface on which circuit is formed and back surface to be processed, temporary adhesive material layer including first temporary adhesive layer composed of thermoplastic resin layer (A) laminated on front surface of wafer and second temporary adhesive layer composed of thermosetting resin layer (B) laminated on first temporary adhesive layer, thermoplastic resin layer (A) being soluble in cleaning liquid (D) after processing wafer, thermosetting resin layer (B) being insoluble in cleaning liquid (D) after heat curing and capable of absorbing cleaning liquid (D) such that cleaning liquid (D) permeates into layer (B). This wafer processing laminate allows a wide selection of materials, facilitates separation and collection of processed wafer, meets requirements on various processes, and can increase productivity of thin wafers.

14 Claims, 1 Drawing Sheet

(51) Int. Cl.
   *B32B 7/06*      (2006.01)
   *B32B 7/12*      (2006.01)
   *C09J 183/04*    (2006.01)
   *C09J 183/10*    (2006.01)
   *C09J 183/14*    (2006.01)
   *C08G 77/52*     (2006.01)
   *C08G 77/04*     (2006.01)
   *C08G 77/455*    (2006.01)

(52) U.S. Cl.
   CPC .......... *C09J 183/14* (2013.01); *H01L 21/304* (2013.01); *H01L 21/6835* (2013.01); *C08G 77/04* (2013.01); *C08G 77/455* (2013.01); *C08G 77/52* (2013.01); *H01L 2221/6834* (2013.01); *H01L 2221/68327* (2013.01); *H01L 2221/68381* (2013.01); *H01L 2221/68386* (2013.01)

(56) References Cited

U.S. PATENT DOCUMENTS

| | | | |
|---|---|---|---|
| 2005/0173064 | A1 | 8/2005 | Miyanari |
| 2005/0233547 | A1* | 10/2005 | Noda ................ B32B 43/006 438/459 |
| 2007/0287242 | A1* | 12/2007 | Kodaira ............ H01L 21/6835 438/197 |
| 2010/0297829 | A1* | 11/2010 | O'Rourke .......... H01L 21/6835 438/459 |
| 2013/0280886 | A1* | 10/2013 | Kato ................ B32B 7/06 438/459 |
| 2014/0154868 | A1* | 6/2014 | Sugo ................ H01L 21/6835 438/458 |
| 2014/0342530 | A1* | 11/2014 | Yasuda .............. C09J 183/14 438/459 |
| 2015/0017434 | A1* | 1/2015 | Dronen ............. H01L 21/6835 428/352 |
| 2015/0064385 | A1* | 3/2015 | Flaim ............... B32B 37/14 428/41.3 |
| 2015/0353793 | A1* | 12/2015 | Yasuda .............. C09J 153/025 438/759 |
| 2016/0189996 | A1* | 6/2016 | Tanabe ............... C08L 83/00 428/354 |
| 2016/0326414 | A1* | 11/2016 | Tagami .............. C09J 183/10 |
| 2017/0069521 | A1* | 3/2017 | Sugo ................ B32B 27/08 |
| 2017/0110360 | A1* | 4/2017 | Tagami .............. C09J 7/22 |
| 2017/0154801 | A1* | 6/2017 | Tagami .............. H01L 21/304 |

FOREIGN PATENT DOCUMENTS

| | | |
|---|---|---|
| JP | 2006-135272 A | 5/2006 |
| JP | 2006-328104 A | 12/2006 |
| JP | 2015179692 A | 10/2015 |

\* cited by examiner

WAFER PROCESSING LAMINATE AND METHOD FOR PROCESSING WAFER

TECHNICAL FIELD

The present invention relates to a wafer processing laminate and a method for processing a wafer which enable a thin wafer to be obtained effectively.

BACKGROUND ART

Three-dimensional semiconductor mounting has become essential for higher density and larger capacity. The three-dimensional mounting technique is a semiconductor production technique for thinning a semiconductor chip and connecting the chip to another chip by a through silicon via (TSV) to form a multilayer. To realize this technique, steps of grinding a non-circuit-forming surface (also referred to as "back surface") of a substrate on which a semiconductor circuit has been formed to thin the substrate, and then forming an electrode including a TSV on the back surface, are required. In the step of grinding the back surface of a silicon substrate, a protective tape for the back surface is conventionally attached to a back side of the surface to be ground to prevent the wafer from breaking during grinding. However, this tape uses an organic resin film as its base, which has flexibility, but inadequate strength and heat resistance. Thus, this tape is not suited to the steps of forming a TSV and forming a wiring layer on the back surface.

In this context, there has been proposed a system in which a semiconductor substrate is bonded to a support made of silicon, glass or the like, through an adhesive layer to sufficiently withstand the steps of grinding the back surface and forming a TSV and an electrode on the back surface. In this system, the adhesive layer used for bonding the substrate and the support is important. The adhesive layer requires a sufficient durability to bond the substrate and the support without gaps and to withstand subsequent steps, and also requires an ability to easily detach a thin wafer from the support finally. The adhesive layer, which is finally removed, is hence referred to as a "temporary adhesive layer" (or temporary adhesive material layer) herein.

With respect to the conventionally known temporary adhesive layer and a method for removing this layer, the following techniques have been proposed: an adhesive material containing a light-absorbing substance is irradiated with high intensity light to decompose the adhesive material layer, whereby the adhesive material layer is removed from the support (Patent Literature 1); a heat fusible hydrocarbon compound is used for the adhesive material, and bonding and removal are carried out in a heat-molten state (Patent Literature 2). The former technique has problems, for example, a long treatment time per substrate. The latter technique is simple because of control only by heat, but thermal stability is insufficient at a high temperature exceeding 200° C., and thus the applicable range is limited. Furthermore, these temporary adhesive layers are not adequate to form a film with uniform thickness on a heavily stepped substrate and to completely adhere to the support.

Moreover, it has been proposed to use a silicone pressure sensitive adhesive for the temporary adhesive material layer (Patent Literature 3). In this technique, a substrate is bonded to a support with an addition-curable silicone pressure sensitive adhesive, and on the removal, the assembly is immersed in a chemical solution capable of dissolving or decomposing the silicone resin to separate the substrate from the support. Thus, this method takes a very long time for separation and is difficult to find application in the actual producing process.

Moreover, there has been proposed a method for separating a support, including forming multiple through holes in the support, supplying a solvent to an adhesive through the through holes, and dissolving the adhesive for separation (Patent Literature 4). In this method, however, the amount of the solvent that can be supplied to the adhesive is limited, and it takes a long time for separation. Thus, this method is difficult to find application in the actual producing process.

CITATION LIST

Patent Literature

PATENT LITERATURE 1: Japanese Patent Laid-Open Publication No. 2004-64040
PATENT LITERATURE 2: Japanese Patent Laid-Open Publication No. 2006-328104
PATENT LITERATURE 3: U.S. Pat. No. 7,541,264
PATENT LITERATURE 4: Japanese Patent Laid-Open Publication No. 2006-135272

SUMMARY OF INVENTION

Technical Problem

The present invention was accomplished in view of the above-described problems, and has an object to provide a wafer processing laminate and a method for processing a wafer that allow a wide selection of materials, facilitate temporary adhesion, enable a heavily stepped substrate to be processed with uniform thickness, have excellent resistance to a wafer thermal process, are highly compatible with steps of forming a TSV and forming a wiring on the wafer back surface, facilitate separation and collection of a processed wafer, meet requirements on various processes, and can increase productivity of thin wafers.

Solution to Problem

To accomplish the object, the present invention provides a wafer processing laminate comprising a support, a temporary adhesive material layer laminated on the support, and a wafer stacked on the temporary adhesive material layer, the wafer having a front surface on which a circuit is formed and a back surface to be processed, the temporary adhesive material layer comprising a first temporary adhesive layer composed of a thermoplastic resin layer (A) laminated on the front surface of the wafer and a second temporary adhesive layer composed of a thermosetting resin layer (B) laminated on the first temporary adhesive layer, the thermoplastic resin layer (A) being soluble in a cleaning liquid (D) after processing the wafer, the thermosetting resin layer (B) being insoluble in the cleaning liquid (D) after heat curing and capable of absorbing the cleaning liquid (D) such that the cleaning liquid (D) permeates into the layer (B).

Such a wafer processing laminate allows a wide selection of materials, facilitates temporary adhesion, enables a heavily stepped substrate to be processed with uniform thickness, has excellent resistance to a wafer thermal process, is highly compatible with steps of forming a TSV and forming a wiring on the wafer back surface, facilitates separation and collection of a processed wafer, meets requirements on various processes, and can increase productivity of thin wafers.

Furthermore, the present invention provides a method for processing a wafer, comprising the steps of:

(a) bonding a support and a front surface of the wafer with a temporary adhesive material layer to produce a wafer processing laminate, the wafer having the front surface on which a circuit is formed and a back surface to be processed, the temporary adhesive material layer comprising a first temporary adhesive layer composed of a thermoplastic resin layer (A) and a second temporary adhesive layer composed of a thermosetting resin layer (B), the thermoplastic resin layer (A) being soluble in a cleaning liquid (D) even after processing the wafer, the thermosetting resin layer (B) being insoluble in the cleaning liquid (D) after heat curing and capable of absorbing the cleaning liquid (D) such that the cleaning liquid (D) permeates into the layer (B);

(b) heat curing the thermosetting resin layer (B);

(c) grinding or polishing the back surface of the wafer;

(d) processing the back surface of the wafer;

(e) removing or separating the support from the wafer processing laminate;

(f) treating the wafer processing laminate, from which the support has been removed or separated, with the cleaning liquid (D) to simultaneously perform dissolution of the thermoplastic resin layer (A) and separation of the thermosetting resin layer (B); and (g) taking out the wafer that remains after the step (f).

Such a method for processing a wafer allows a wide selection of materials, has excellent resistance to a wafer thermal process, is highly compatible with steps of forming a TSV and forming a wiring on the wafer back surface, meets requirements on various processes, facilitates separation and collection of a processed circuit wafer (a wafer having a front surface on which a circuit is formed and a back surface to be processed), and can increase productivity of thin wafers.

In these aspects, the temporary adhesive material layer preferably further comprises a third temporary adhesive layer composed of a separation layer (C) laminated between the support and the thermosetting resin layer (B), wherein the separation layer (C) does not remain on the thermosetting resin layer (B) when the support is separated from the wafer processing laminate along the separation layer (C).

Alternatively, the temporary adhesive material layer preferably further comprises a third temporary adhesive layer composed of a separation layer (C) laminated between the support and the thermosetting resin layer (B), wherein when the support is separated from the wafer processing laminate along the separation layer (C), the separation layer (C) can partially or completely remain on the thermosetting resin layer (B), and the separation layer (C) is soluble in the cleaning liquid (D), or insoluble in the cleaning liquid (D) and capable of absorbing the cleaning liquid (D) such that the cleaning liquid (D) permeates into the layer (C). In this case, the dissolution of the thermoplastic resin layer (A), the separation of the thermosetting resin layer (B), and dissolution or separation of the separation layer (C) are simultaneously performed in the step (f).

When the wafer processing laminate includes such separation layer (C), the support can be easily separated from the wafer processing laminate.

Additionally, the thermoplastic resin layer (A) preferably contains one or more of an aliphatic hydrocarbon resin and an aromatic hydrocarbon resin.

Such thermoplastic resin layer (A) can be easily formed on the wafer, has excellent resistance to a wafer thermal process, is highly compatible with steps of forming a TSV and forming a wiring on the wafer back surface, and can be easily cleaned with the cleaning liquid (D), thus increasing productivity of thin wafers.

Additionally, the thermosetting resin layer (B) preferably contains one or more of a silicone resin, an epoxy resin, a polyimide resin, an acrylic resin, and a phenol resin.

Such thermosetting resin layer (B) facilitates temporary adhesion, enables a heavily stepped substrate to be processed with uniform thickness, has excellent resistance to a wafer thermal process, is highly compatible with steps of forming a TSV and forming a wiring on the wafer back surface, meets requirements on various processes, and can be easily separated with the cleaning liquid (D), thus increasing productivity of thin wafers.

Additionally, the cleaning liquid (D) is preferably one or more organic solvents selected from an aliphatic hydrocarbon solvent, an aromatic hydrocarbon solvent, a ketone solvent, an alcohol solvent, an ether solvent, an ester solvent, an amine solvent, an ammonium solvent, and an organic acid solvent, or a mixed solution containing the organic solvent and one or more liquids selected from a basic aqueous solution, an acidic aqueous solution, and water.

Such cleaning liquid (D) facilitates the dissolution of the thermoplastic resin layer (A) and the separation of the thermosetting resin layer (B) without damaging the front surface of the wafer.

Additionally, the separation layer (C) preferably contains one or more of a thermoplastic silicone material, a thermosetting silicone material, a fluorine material, an aliphatic hydrocarbon material, and an aromatic hydrocarbon material.

Additionally, one or more of adhesive strength between the support and the separation layer (C), adhesive strength between the thermosetting resin layer (B) and the separation layer (C), and cohesive failure strength of the separation layer (C) are preferably lower than adhesive strength between the thermoplastic resin layer (A) and the thermosetting resin layer (B).

Additionally, one or more of adhesive strength between the support and the separation layer (C), adhesive strength between the thermosetting resin layer (B) and the separation layer (C), and cohesive failure strength of the separation layer (C) are preferably decreased when the wafer processing laminate is plane-irradiated or laser-irradiated with X-rays, ultraviolet rays, visible rays, infrared rays, or light having wavelengths within a specific range.

Such separation layer (C) enables the support to be easily separated from the wafer processing laminate.

Advantageous Effects of Invention

The inventive wafer processing laminate includes a support, a temporary adhesive material layer laminated on the support, and a circuit wafer stacked on the temporary adhesive material layer. The temporary adhesive material layer includes a first temporary adhesive layer composed of a thermoplastic resin layer (A) laminated on the front surface of the wafer and a second temporary adhesive layer composed of a thermosetting resin layer (B) laminated on the first temporary adhesive layer. The thermoplastic resin layer (A) is soluble in a cleaning liquid (D) after processing the wafer. The thermosetting resin layer (B) is insoluble in the cleaning liquid (D) after heat curing and capable of absorbing the cleaning liquid (D) such that the cleaning liquid (D) permeates into the layer (B). According to this structure, the support and then the adhesive material layer can be easily and conveniently separated from the wafer processing laminate only by treatment with the cleaning liquid (D) to take out the wafer. In addition, the processing method, which collects wafers by one-time treatment with the liquid, allows a wide range of materials to be used for the temporary adhesive material layer and thus meets requirements on various processes. Therefore, this method facilitates temporary adhesion, enables a heavily stepped substrate to be processed with uniform thickness, has excellent resistance to a wafer thermal process such as chemical vapor deposition (CVD), is highly compatible with steps of forming a TSV and forming a wiring on the wafer back surface, and can increase productivity of thin wafers.

DESCRIPTION OF EMBODIMENTS

Hereinafter, the present invention will be described in detail.

As mentioned above, it has been desired to develop a wafer processing laminate and a method for processing a wafer that allow a wide selection of materials, facilitate temporary adhesion, enable a heavily stepped substrate to be processed with uniform thickness, have excellent resistance to a wafer thermal process, are highly compatible with steps of forming a TSV and forming a wiring on the wafer back surface, facilitate separation and collection of a processed wafer, meet requirements on various processes, and can increase productivity of thin wafers.

The present inventors earnestly studied to accomplish the above object and consequently invented a wafer processing laminate which includes a support, a temporary adhesive material layer laminated on the support, and a circuit wafer stacked on the temporary adhesive material layer, the temporary adhesive material layer including a first temporary adhesive layer composed of a thermoplastic resin layer (A) laminated on the front surface of the circuit wafer and a second temporary adhesive layer composed of a thermosetting resin layer (B) laminated on the first temporary adhesive layer, the thermoplastic resin layer (A) being soluble in a cleaning liquid (D) after processing the circuit wafer, the thermosetting resin layer (B) being insoluble in the cleaning liquid (D) after heat curing and capable of absorbing the cleaning liquid (D) such that the cleaning liquid (D) permeates into the layer (B). They found that this structure enables the support and then the adhesive material layer to be easily and conveniently separated from the wafer processing laminate only by treatment with the cleaning liquid (D) to take out the circuit wafer and thus can increase productivity of thin wafers, thereby bringing the present invention to completion.

Figure 1:
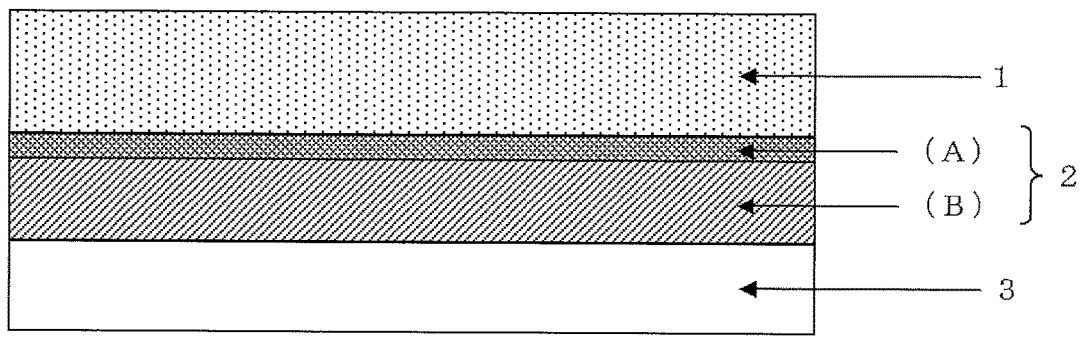
FIG. 1 is a cross-sectional view of a wafer processing laminate according to an embodiment of the present invention.
Figure 2:
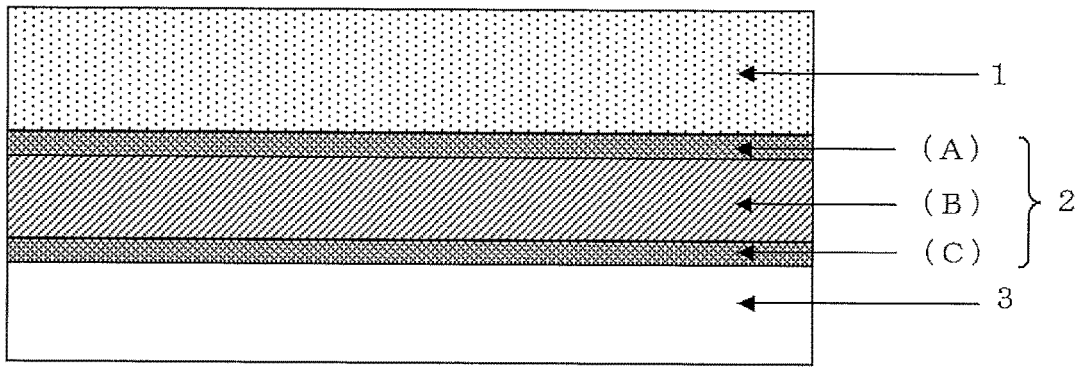
FIG. 2 is a cross-sectional view of a wafer processing laminate according to another embodiment of the present invention.

FIG. 1 is a cross-sectional view of a wafer processing laminate according to an embodiment of the present invention. As shown in FIG. 1, the wafer processing laminate of the present invention has a wafer (a circuit wafer) 1 having a front surface on which a circuit is formed and a back surface to be processed, a support 3 for supporting the wafer 1 during processing the wafer 1, and a temporary adhesive material layer 2 placed between the wafer 1 and the support 3. The temporary adhesive material layer 2 includes a first temporary adhesive layer composed of a thermoplastic resin layer (A) laminated on the circuit side of the wafer 1 and a second temporary adhesive layer composed of a thermosetting resin layer (B) laminated on the first temporary adhesive layer. The temporary adhesive material layer may further include a third temporary adhesive layer composed of a separation layer (C) laminated between the support 3 and the second temporary adhesive layer, as shown in FIG. 2.

The present invention will now be described in more detail, but the present invention is not limited thereto.

[Temporary Adhesive Layer]

—First Temporary Adhesive Layer/Thermoplastic Resin Layer (A)—

The thermoplastic resin layer (A) is composed of a thermoplastic resin that is soluble in the cleaning liquid (D) after processing the back surface of the circuit wafer. This resin is preferably, but not particularly limited to, an aliphatic hydrocarbon resin and an aromatic hydrocarbon resin. In particular, a thermoplastic resin having a glass transition temperature of about −80 to 120° C. is preferable. Examples thereof include an olefin type thermoplastic elastomer, a polybutadiene type thermoplastic elastomer, a styrene type thermoplastic elastomer, a styrene-butadiene type thermoplastic elastomer, and a styrene-polyolefin type thermoplastic elastomer. A hydrogenated polystyrene type elastomer excellent in heat resistance is particularly suitable. More specifically, there may be mentioned Tuftec (Asahi Kasei Chemicals Corporation), ESPOLEX SB series (Sumitomo Chemical Co., Ltd.), RABALON (Mitsubishi Chemical Corporation), SEPTON (Kuraray Co., Ltd.), and DYNARON (JSR Corporation). In addition, there may be mentioned a cycloolefin polymer represented by ZEONEX (ZEON Corporation) and a cyclic olefin copolymer represented by TOPAS (Nippon Polyplastics Co., Ltd.). The thermoplastic resin layer (A) may be one of the above resin materials, or a mixture of two or more resins.

Such a thermoplastic resin layer is highly compatible with the step of processing the back surface of the circuit wafer, and can be easily dissolved in the cleaning liquid (D) to take out the circuit wafer alone after processing the back surface. Thus, a fragile thin wafer can be easily handled.

A method for laminating the thermoplastic resin layer (A) on the circuit wafer is not particularly limited. In the case that the layer (A) is directly laminated on the front surface of the circuit wafer, for example, spin coating, spray coating, slit coating, and film laminating methods are preferably employed; especially, the spin coating method is preferably used. These methods enable lamination without gaps between the circuit wafer surface and the thermoplastic resin layer (A). In the spin coating method, resin materials of the thermoplastic resin layer (A) are dissolved in a solvent, and the solution is applied on the circuit wafer to form the layer. Examples of the solvent include hydrocarbon solvents, preferably, such as nonane, p-menthane, pinene, and isooctane. Among them, nonane, p-menthane, and isooctane are more preferable because of their coating properties. In the case that the thermoplastic resin layer (A) is laminated on the thermosetting resin layer (B) on the support and then laminated on the front surface of the circuit wafer surface by bonding, for example, spin coating, spray coating, slit coating, and film laminating methods, especially the spin coating and film laminating methods are preferably used to laminate the thermoplastic resin layer (A) on the thermosetting resin layer (B). When the thermoplastic resin layer (A) is laminated by the spin coating method, a solvent is preferably used in an amount of 250 to 100,000 parts, more preferably 400 to 20,000 parts, particularly preferably 600 to 10,000 parts, based on 100 parts of the resin.

Although the thickness of the thermoplastic resin layer (A) formed on either side is not limited, the resin layer is desirably formed according to unevenness on the circuit wafer. The thickness is preferably 0.01 to 50 μm, more preferably 0.02 to 20 μm, particularly preferably 0.05 to 10 μm.

To the thermoplastic resin layer (A) may be added an antioxidant for improving heat resistance, and a surfactant for improving coating property. Illustrative examples of the antioxidant that can be suitably used include di-tert-butylphenol although not particularly limited thereto. Such an antioxidant does not adversely affect the workability at producing the wafer processing laminate and the process resistance at processing the back surface of the circuit wafer, and thus is preferable. Illustrative examples of the surfactant that can be suitably used include a fluorinated silicone surfactant X-70-1102 (available from Shin-Etsu Chemical Co., Ltd.) although not particularly limited thereto. Such a surfactant does not adversely affect the heat resistance and thus is preferable.

—Second Temporary Adhesive Layer/Thermosetting Resin Layer (B)—

The thermosetting resin layer (B) is composed of a thermosetting resin that is insoluble in the cleaning liquid (D) after heat curing and capable of absorbing the cleaning liquid (D) such that the cleaning liquid (D) permeates into the layer (B). This resin is preferably, but not particularly limited to, a silicone resin, an epoxy resin, a polyimide resin, an acrylic resin, and a phenol resin. These resins may be used alone or in combination of two or more kinds. To promote the absorption of the cleaning liquid (D) and the permeation of the cleaning liquid (D) in the thermosetting resin layer (B), an appropriate cleaning liquid (D) is preferably selected according to the kind of the thermosetting resin layer (B).

An example of the thermosetting resin layer (B) that contains a silicone resin is a phenol-group-containing silicone-modified thermosetting resin layer of a composition containing 100 parts by mass of a siloxane bond-containing polymer having a repeating unit shown by the following general formula (1) and a weight average molecular weight of 3,000 to 500,000, and 0.1 to 50 parts by mass of one or more crosslinkers selected from the group consisting of an amino condensate modified with formalin or formalin-alcohol, a phenol compound having on average two or more methylol or alkoxymethylol groups per molecule, and an epoxy compound having on average two or more epoxy groups per molecule.

atoms; "m" is an integer of 1 to 100; B is a positive number; A is 0 or a positive number; and X is a divalent organic group shown by the following general formula (2),

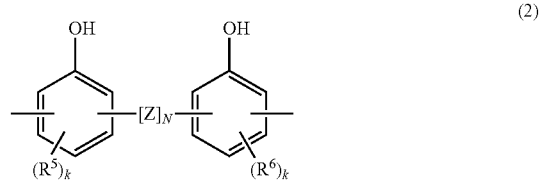

wherein Z represents a divalent organic group selected from any of

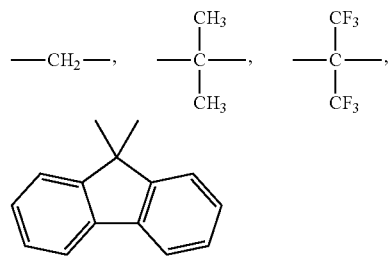

N represents 0 or 1; $R^5$ and $R^6$ each represent an alkyl or alkoxy group having 1 to 4 carbon atoms, and may be the same or different from each other; and "k" represents 0, 1, or 2.

In this case, illustrative examples of $R^1$ to $R^4$ include alkyl groups such as a methyl group and an ethyl group, and a phenyl group. "m" preferably represents an integer of 3 to 60, more preferably 8 to 40. B/A ranges from 0 to 20, particularly from 0.5 to 5.

Another preferable example of the thermosetting resin layer (B) that contains a silicone resin is an epoxy-group-containing silicone-modified thermosetting resin layer of a composition containing 100 parts by mass of a siloxane bond-containing polymer having a repeating unit shown by the following general formula (3) and a weight average molecular weight of 3,000 to 500,000, and 0.1 to 50 parts by mass of one or more crosslinkers selected from the group consisting of a phenol compound having on average two or more phenol groups per molecule and an epoxy compound having on average two or more epoxy groups per molecule,

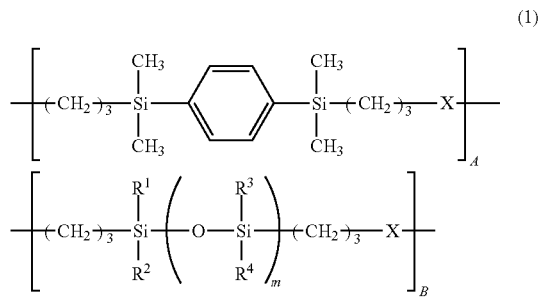

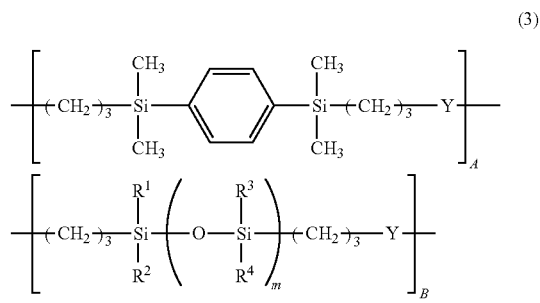

wherein $R^1$ to $R^4$ may be the same or different, and represent a monovalent hydrocarbon group having 1 to 8 carbon atoms; "m" is an integer of 1 to 100; B is a positive number;

A is 0 or a positive number; and Y is a divalent organic group shown by the following general formula (4),

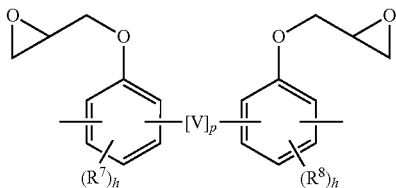

(4)

wherein V represents a divalent organic group selected from any of

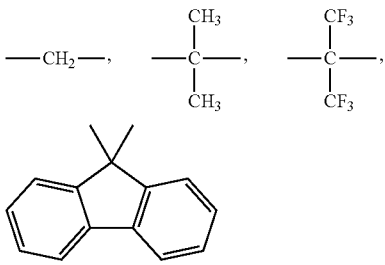

"p" represents 0 or 1; $R^7$ and $R^8$ each represent an alkyl or alkoxy group having 1 to 4 carbon atoms, and may be the same or different from each other; and "h" represents 0, 1, or 2.

In this case, illustrative examples of $R^1$ to $R^4$ and "m" are the same as in the general formula (1).

The thermosetting resin layer (B) may be a combination of the polymers shown by the general formulae (1) and (3). In this case, the (polymerization) ratio of (1):(3) is preferably from 0.1:99.9 to 99.9:0.1, more preferably from 1:99 to 99:1.

The thermosetting compositions mainly consisting of the thermosetting silicone-modified polymers of the general formula (1) and/or (3) contain one or more crosslinkers for heat curing. In the case of the phenol-group-containing silicone-modified polymer of the general formula (1), the crosslinker is selected from an amino condensate modified with formalin or formalin-alcohol, a phenol compound having on average two or more methylol or alkoxymethylol groups per molecule, and an epoxy compound having on average two or more epoxy groups per molecule.

Examples of the amino condensate modified with formalin or formalin-alcohol include a melamine resin modified with formalin or formalin-alcohol and a urea resin modified with formalin or formalin-alcohol.

For example, the melamine resin (condensate) modified with formalin or formalin-alcohol can be prepared by the following procedure. Firstly, a melamine monomer is modified with formalin into a methylol form, and optionally, the resultant compound is further modified with alcohol into an alkoxy form according to a known method to obtain a modified melamine shown by the formula (5). The alcohol is preferably a lower alcohol such as an alcohol having 1 to 4 carbon atoms.

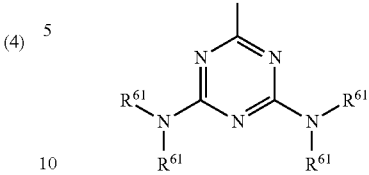

(5)

wherein each $R^{61}$ may be the same or different and represents a methylol group, an alkoxymethyl group containing an alkoxy group having 1 to 4 carbon atoms, or a hydrogen atom, provided that at least one $R^{61}$ is a methylol group or the alkoxymethyl group.

Illustrative examples of the modified melamine shown by the formula (5) include trimethoxymethyl monomethylol melamine, dimethoxymethyl monomethylol melamine, trimethylol melamine, hexamethylol melamine, and hexamethoxymethylol melamine. Then, the modified melamine shown by the formula (5) or a multimer thereof (e.g. oligomer including dimer and trimer) is polymerized by addition condensation with formaldehyde until a desired molecular weight is achieved according to a known method. The melamine resin modified with formalin or formalin-alcohol is thereby obtained. The modified melamine resin may be obtained from one or more of a monomer shown by the formula (5) and a multimer thereof. The modified melamine may be used alone or in combination of two or more kinds.

The urea resin (condensate) modified with formalin or formalin-alcohol can be prepared by modifying a urea condensate having a desired molecular weight with formalin into a methylol form, and optionally, further modifying the resultant compound with alcohol into an alkoxy form, according to a known method. Illustrative examples of the urea condensate modified with formalin or formalin-alcohol include a methoxymethylated urea condensate, an ethoxymethylated urea condensate, and a propoxymethylated urea condensate. The modified urea resin may be used alone or in combination of two or more kinds.

Examples of the phenol compound having on average two or more methylol groups or alkoxymethylol groups per molecule include (2-hydroxy-5-methyl)-1,3-benzenedimethanol and 2,2',6,6'-tetramethoxymethyl bisphenol A. These phenol compounds may be used alone or in combination of two or more kinds.

On the other hand, in the case of the epoxy-group-containing silicone-modified polymer of the general formula (3), the composition contains one or more crosslinkers selected from an epoxy compound having on average two or more epoxy groups per molecule and a phenol compound having on average two or more phenol groups per molecule.

Here, the epoxy compound having a polyfunctional epoxy group used in the polymers of the general formulae (1) and (3) is not particularly limited. In particular, a bi-functional, a tri-functional, or a tetra-functional or more of the polyfunctional epoxy resins, for example, EOCN-1020, EOCN-102S, XD-1000, NC-2000-L, EPPN-201, GAN, and NC6000 all available from Nippon Kayaku Co., Ltd., or a crosslinker shown by the following formula may be contained.

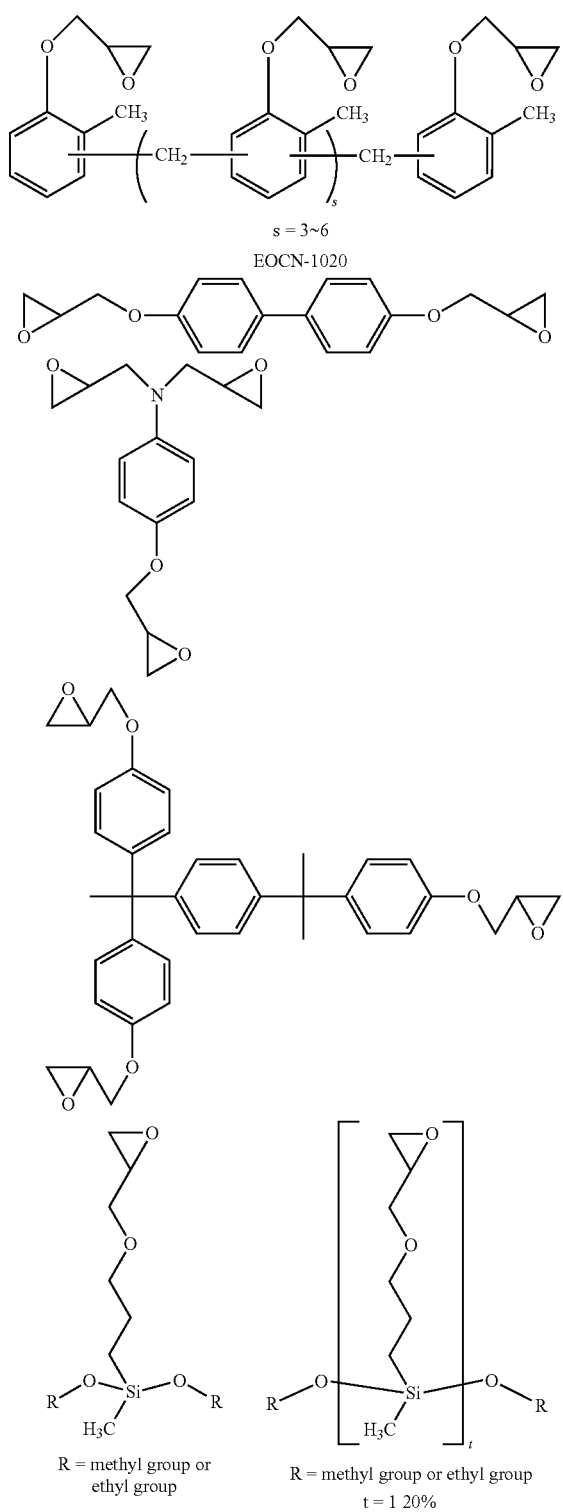

able from Honshu Chemical Industry Co., Ltd., and tetra-functional phenol compounds such as TEP-TPA available from Asahi Organic Chemicals Industry Co., Ltd., etc.

The formulation amount of the crosslinker is 0.1 to 50 parts by mass, preferably 0.1 to 30 parts by mass, more preferably 1 to 20 parts by mass, based on 100 parts by mass of the thermosetting silicone-modified polymer. Two, three or more crosslinkers may be blended in combination.

A curing catalyst such as an acid anhydride may be added in an amount of 10 parts by mass or less based on 100 parts by mass of the thermosetting silicone-modified polymer.

When the composition containing the thermosetting silicone-modified polymer is used, the composition may be dissolved in a solvent to form the layer by the spin coating, spray coating, slit coating, or film laminating method. In this case, examples of the solvent include ketones such as cyclohexanone, cyclopentanone, and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxy propionate, tert-butyl acetate, tert-butyl propionate, propylene glycol mono-tert-butyl ether acetate, and γ-butyrolactone. These solvents may be used alone or in combination of two or more kinds. The amount of the solvent to be added to the composition containing the thermosetting silicone-modified polymer is preferably selected such that the thermosetting silicone-modified polymer concentration is in the range of 1 to 70 mass % if the layer is formed by the spin coating method.

In addition, a known antioxidant and a filler such as silica may be added in an amount of 50 parts by mass or less based on 100 parts by mass of the thermosetting silicone-modified polymer to improve heat resistance. Moreover, a surfactant may be added to improve coating uniformity. Illustrative examples of the antioxidant that can be added include hindered phenol compounds such as tetrakis[methylene-(3,5-di-tert-butyl-4-hydroxyhydrocinnamate)]methane (product name: Adekastab AO-60).

Illustrative examples of the thermosetting resin layer (B) that can be suitably used include a thermosetting silicone-modified polyimide resin layer including a composition containing 100 parts by mass of a polyimide resin having a repeating unit shown by the general formula (6) with an average molecular weight of 5,000 to 150,000, 0.1 to 20 parts by mass of an epoxy resin, and 0.05 to 5 parts by mass of an imidazole compound.

(6)

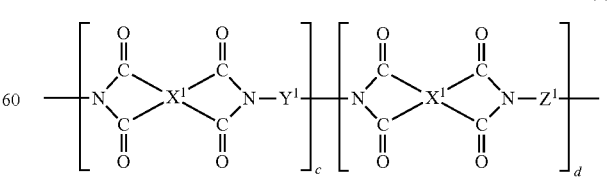

In the general formula (6), $X^1$ represents at least one of tetravalent organic groups shown by the following four formulae:

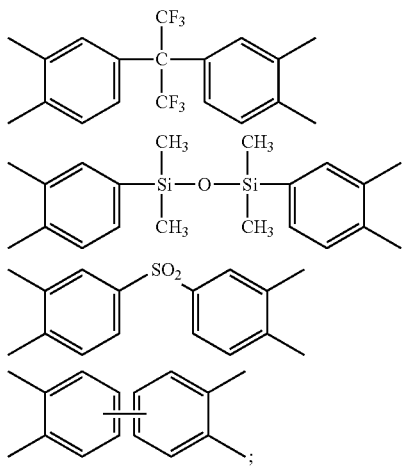

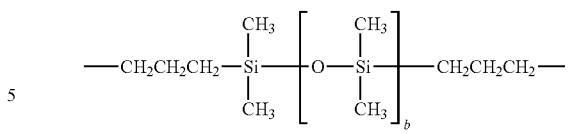

where "b" represents an integer satisfying $40 \le b \le 100$.

The thermosetting composition mainly consisting of the thermosetting silicone-modified polyimide resin shown by the general formula (6) contains one or more epoxy compounds (epoxy resins) having on average two or more epoxy groups per molecule as a crosslinker for heat curing. The epoxy compound having a polyfunctional epoxy group used for the resin of the general formula (6) is preferably, but not particularly limited to, an epoxy compound shown by the formula:

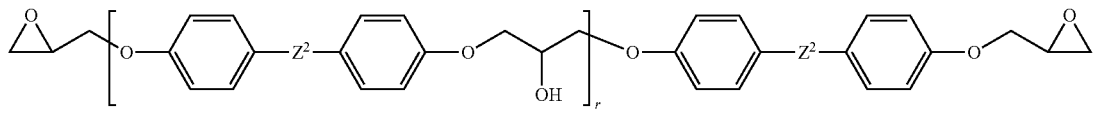

where "c" and "d" satisfy $0.7 \le c/(c+d) \le 0.98$ and $0.02 \le d/(c+d) \le 0.3$; $Y^1$ represents 30 to 99 mol % of a divalent aromatic organic group having a hydroxyl group shown by the following formula:

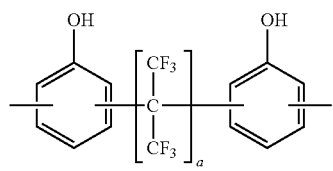

where "a" represents 0 or 1, and 1 to 70 mol % of a divalent aromatic organic group shown by the following formula:

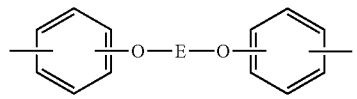

where E represents one of divalent organic groups shown by the following three formulae:

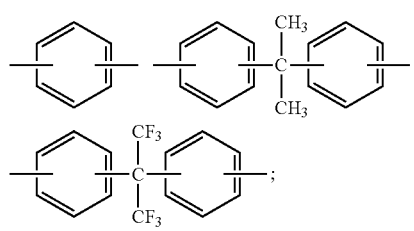

and $Z^1$ represents a divalent siloxane group shown by the following formula:

wherein $Z^2$ represents —$CH_2$— or —$C(CH_3)_2$—; the former is bisphenol F, and the latter is bisphenol A. The bisphenol F type and the bisphenol A type of epoxy resins may be used in combination. "r" represents an integer of 0 or more. Since this compound is not a single substance but a mixture, "r" is on average 0 to 200, preferably 0 to 10, more preferably 0.1 to 1.0.

The formulation amount of the epoxy resin component is typically 0.1 to 20 parts by mass, preferably 5 to 15 parts by mass, based on 100 parts by mass of the polyimide resin. When the amount of epoxy resin component is 0.1 part by mass or more, the resulting cured film has a sufficient resistance to the solvent. When the amount is 20 parts by mass or less, good heat resistance can be obtained.

Moreover, the thermosetting composition mainly consisting of the thermosetting silicone-modified polyimide resin shown by the general formula (6) contains an imidazole compound as a catalyst for curing the polyimide resin and the epoxy resin. Examples of the imidazole compound include the following compound,

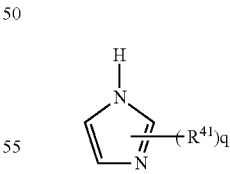

wherein $R^{41}$ represents a monovalent organic group or a hydrogen atom; "q" represents an integer of 1 to 3. When "q" is 2 or 3, each $R^{41}$ may be the same or different.

Examples of the monovalent organic group represented by $R^{41}$ include alkyl groups having 1 to 20 carbon atoms such as a methyl group, an ethyl group, a propyl group, and an undecyl group; and aryl groups such as a phenyl group. The monovalent organic group may be a group obtained by substituting a part or all of hydrogen atoms in the above groups with hydroxyl groups as needed, such as a hydroxyalkyl group. Illustrative examples of the imidazole compound include 2-methyl imidazole, 2-ethyl imidazole, 2-undecyl imidazole, 2-ethyl-4-methyl imidazole, and 2-phenyl-4,5-dihydroxymethyl imidazole; preferable is 2-methyl imidazole, 2-ethyl imidazole, and 2-phenyl-4,5-dihydroxymethyl imidazole. The formulation amount of the imidazole compound in the composition is typically 0.05 to 5 parts by mass, preferably 0.1 to 5 parts by mass, based on 100 parts by mass of the polyimide resin. When the formulation amount is 0.05 part by mass or more, curability is sufficient. When the amount is 5 parts by mass or less, good heat resistance can be obtained.

When the composition containing the thermosetting silicone-modified polyimide resin is used, the composition may be dissolved in a solvent to form the layer by the spin coating, spray coating, slit coating, or film laminating method. Illustrative examples of the solvent preferably used include ethers such as tetrahydrofuran and anisole; ketones such as cyclohexanone, 2-butanone, methyl isobutyl ketone, 2-heptanone, 2-octanone, and acetophenone; esters such as butyl acetate, methyl benzoate, and γ-butyrolactone; cellosolves such as butyl cellosolve acetate and propylene glycol monomethyl ether acetate; amides such as N,N-dimethylformamide, N,N-dimethylacetamide, and N-methyl-2-pyrrolidone; and aromatic hydrocarbons such as toluene and xylene. Among them, ketones, esters, and cellosolves are preferable, and γ-butyrolactone, propylene glycol monomethyl ether acetate, and N-methyl-2-pyrrolidone are particularly preferable. These solvents may be used alone or in combination of two or more kinds. The amount of the solvent to be added to the composition containing the thermosetting silicone-modified polyimide resin is preferably selected such that the polyimide resin concentration is in the range of 1 to 50 mass % if the layer is formed by the spin coating method.

In addition, a known antioxidant and a filler such as silica may be added in an amount of 50 parts by mass or less based on 100 parts by mass of the thermosetting silicone-modified polyimide resin to improve heat resistance. Moreover, a surfactant may be added to improve coating uniformity. Illustrative examples of the antioxidant that can be added include hindered phenol compounds such as tetrakis[methylene-(3,5-di-tert-butyl-4-hydroxyhydrocinnamate)]methane (product name: Adekastab AO-60).

Examples of the thermosetting resin layer (B) containing an epoxy resin include a silicone-modified thermosetting resin layer containing the siloxane-bond-containing polymer having a repeating unit shown by the general formula (3), described above.

Examples of the thermosetting resin layer (B) containing a phenol resin include a silicone-modified thermosetting resin layer containing the siloxane-bond-containing polymer having a repeating unit shown by the general formula (1), described above.

A method for laminating the thermosetting resin layer (B) is not particularly limited. For example, spin coating, spray coating, slit coating, and film laminating methods are preferably employed; especially, the spin coating and film laminating methods are preferably used. These methods enable lamination without gaps between adjacent layers. The thermosetting resin layer (B) may be formed on the thermoplastic resin layer (A) laminated on the circuit wafer, the support, or the separation layer (C) laminated on the support. Any of them can be selected.

Although the thickness of the thermosetting resin layer (B) is not limited, the resin layer is desirably formed according to unevenness on the circuit wafer. The thickness is preferably 1 to 200 μm, more preferably 10 to 150 μm, particularly preferably 20 to 100 μm.

—Third Temporary Adhesive Layer/Separation Layer (C)—

The separation layer (C) is an optional component interposed between the thermosetting resin layer (B) and the support to easily separate the support from the wafer processing laminate. The separation layer (C) is not required when the adhesive strength between the support and the thermosetting resin layer (B) directly laminated thereon is controllable to separate the support, or when the support can be removed without separation by, for example, grinding and removing the support with a grinder. However, the separation layer (C) is preferably formed to easily separate the support.

The separation layer (C) is not particularly limited as long as the layer has the following characteristic (I) or (II).

(I) when the support is separated from the wafer processing laminate along the separation layer (C), the separation layer (C) does not remain on the thermosetting resin layer (B).

(II) when the support is separated from the wafer processing laminate along the separation layer (C), the separation layer (C) can partially or completely remain on the thermosetting resin layer (B), and the separation layer (C) is soluble in the cleaning liquid (D), or insoluble in the cleaning liquid (D) and capable of absorbing the cleaning liquid (D) such that the cleaning liquid (D) permeates into the layer (C).

When the wafer processing laminate includes the separation layer (C), the support can be separated from the wafer processing laminate, for example, by a room-temperature mechanical separation method in which the support is mechanically separated under normal atmospheric conditions or a light laser separation method in which the adhesive strength is changed by irradiation with light or laser to enable separation.

The separation layer (C) suited to the room-temperature mechanical separation method is, for example, a layer containing one or more of a thermoplastic silicone material, a thermosetting silicone material, a fluorine material, an aliphatic hydrocarbon material, and an aromatic hydrocarbon material. Such a layer is preferably used.

Among the separation layer (C), examples of the layer that has the characteristic (I) include a layer containing one or more of a thermosetting silicone material, a fluorine material, an aliphatic hydrocarbon material, and an aromatic hydrocarbon material. To improve the characteristic (I) in the layer containing such materials, the layer preferably has a peeling force of 0.5 gf or more and 50 gf or less which is required for peeling the thermosetting polymer layer (B) along an interface between the thermosetting polymer layer (B) and the separation layer (C) when the polymer layer (B) laminated on the separation layer (C) on the support is thermally cured, as measured by 180° peeling using a test piece having a width of 25 mm. Examples of the layer that has the characteristic (II) include a layer containing one or more of a thermoplastic silicone material, an aliphatic hydrocarbon material, and an aromatic hydrocarbon material. To improve the characteristic (II) in the layer containing such materials, the layer preferably has a peeling force of 0.5 gf or more and 50 gf or less which is required for peeling the thermosetting polymer layer (B) with cohesion failure of the separation layer (C) when the polymer layer (B) laminated on the separation layer (C) on the support is thermally cured, as measured by 180° peeling using a test piece having a width of 25 mm. When the peeling force is 0.5 gf or more, the adhesive strength is sufficient to withstand the process.

When the peeling force is 50 gf or less, the support can be easily debonded by the room-temperature mechanical separation method.

When the wafer processing laminate includes the separation layer (C), the support can be easily separated from the wafer processing laminate by controlling one or more of adhesive strength (interface adhesive strength) between the support and the separation layer (C), adhesive strength between the thermosetting resin layer (B) and the separation layer (C), and cohesive failure strength of the separation layer (C). In particular, these properties such as adhesive strength are preferably lower than adhesive strength between the thermoplastic resin layer (A) and the thermosetting resin layer (B).

When the light laser separation method is employed to separate the support from the wafer processing laminate, the separation layer (C) preferably has a characteristic in which one or more of adhesive strength between the support and the separation layer (C), adhesive strength between the thermosetting resin layer (B) and the separation layer (C), and cohesive failure strength of the separation layer (C) are decreased by plane-irradiation or laser-irradiation with X-rays, ultraviolet rays, visible rays, infrared rays, or light having wavelengths within a specific range. The specific range may be 200 nm to 500 nm. This allows the support to be easily separated from the wafer processing laminate. The separation layer (C) suited to the light laser separation method is, for example, a thermosetting naphthalene derivative separation layer, described below.

The thermosetting naphthalene derivative separation layer can absorb light having wavelengths within the above range. The thermosetting naphthalene derivative separation layer preferably intercepts 85% or more of light having wavelength of 500 nm or less.

Illustrative examples of the separation layer (C) containing a thermoplastic silicone material suited to the room-temperature mechanical separation method include a thermoplastic organopolysiloxane separation layer that includes a thermoplastic organopolysiloxane containing 99.000 to 99.999 mol %, preferably 99.500 to 99.999 mol % of a siloxane unit (D unit) shown by $R^{11}R^{12}SiO_{2/2}$, 1.000 to 0.001 mol %, preferably 0.500 to 0.001 mol % of a siloxane unit (M unit) shown by $R^{13}R^{14}R^{15}SiO_{1/2}$, and 0.000 to 0.500 mol %, preferably 0.000 to 0.100 mol % of a siloxane unit (T unit) shown by $R^{16}SiO_{3/2}$. The thermoplastic organopolysiloxane has a weight average molecular weight of 200,000 to 1,000,000, preferably 400,000 to 900,000 and contains 0.5 mass % or less of a low molecular weight component having a molecular weight of 740 or less.

In the above formulae, the organic substituents $R^{11}$, $R^{12}$, $R^{13}$, $R^{14}$, $R^{15}$, and $R^{16}$ represent an unsubstituted or substituted monovalent hydrocarbon group, preferably an unsubstituted or substituted monovalent hydrocarbon group having 1 to 10 carbon atoms. Illustrative examples thereof include hydrocarbon groups, e.g., alkyl groups such as a methyl group, an ethyl group, an n-propyl group, an isopropyl group, an n-butyl group, a tert-butyl group, an n-pentyl group, a cyclopentyl group, and an n-hexyl group, cycloalkyl groups such as a cyclohexyl group, aryl groups such as a phenyl group and a tolyl group; and groups in which a part or all of hydrogen atoms of the above groups are substituted with halogen atoms. Among them, a methyl group and a phenyl group are preferable.

Another example of the separation layer (C) containing a thermoplastic silicone material suited to the room-temperature mechanical separation method is a thermoplastic resin-modified organopolysiloxane separation layer that includes a thermoplastic resin-modified organopolysiloxane obtained by a partially dehydration condensation of an organopolysiloxane shown by the following general formula (7) and an organopolysiloxane resin containing an $R^{21}R^{22}R^{23}SiO_{1/2}$ unit, where $R^{21}$, $R^{22}$ and $R^{23}$ each represent a hydroxyl group or an unsubstituted or substituted monovalent hydrocarbon group having 1 to 10 carbon atoms, and an $SiO_{4/2}$ unit with an $R^{21}R^{22}R^{23}SiO_{1/2}$ unit/$SiO_{4/2}$ unit mole ratio ranging from 0.6 to 1.7. This partially dehydrated condensate has a ratio (mass ratio) of the organopolysiloxane to the organopolysiloxane resin of 99:1 to 50:50 and a weight average molecular weight of 400,000 to 1,500,000 and contains 0.5 mass % or less of a low molecular weight component having a molecular weight of 740 or less.

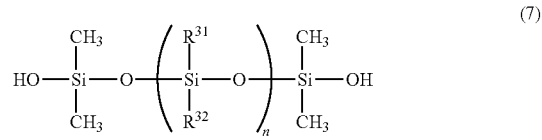

(7)

wherein $R^{31}$ and $R^{32}$ each represent an unsubstituted or substituted monovalent hydrocarbon group having 1 to 10 carbon atoms, and "n" represents 5,000 to 10,000.

In the above formula, $R^{31}$ and $R^{32}$ represent an unsubstituted or substituted monovalent hydrocarbon group having 1 to 10 carbon atoms. Illustrative examples thereof include monovalent hydrocarbon groups, e.g., alkyl groups such as a methyl group, an ethyl group, an n-propyl group, an isopropyl group, an n-butyl group, a tert-butyl group, an n-pentyl group, a cyclopentyl group, and an n-hexyl group, cycloalkyl groups such as a cyclohexyl group, aryl groups such as a phenyl group and a tolyl group; and groups in which a part or all of hydrogen atoms of the above groups are substituted with halogen atoms. Among them, a methyl group and a phenyl group are preferable.

$R^{21}$, $R^{22}$ and $R^{23}$ represent a hydroxyl group or an unsubstituted or substituted monovalent hydrocarbon group having 1 to 10 carbon atoms. Illustrative examples thereof include monovalent hydrocarbon groups, e.g., alkyl groups such as a methyl group, an ethyl group, an n-propyl group, an isopropyl group, an n-butyl group, a tert-butyl group, an n-pentyl group, a cyclopentyl group, and an n-hexyl group, cycloalkyl groups such as a cyclohexyl group, aryl groups such as a phenyl group and a tolyl group; groups in which a part or all of hydrogen atoms of the above groups are substituted with halogen atoms; and a hydroxyl group. Among them, a methyl group is preferable.

The organopolysiloxane resin containing an $R^{21}R^{22}R^{23}SiO_{1/2}$ unit (M unit) and an $SiO_{4/2}$ unit (Q unit) (hereinafter, also referred to as MQ resin) may contain a hydroxyl group bonded to a silicon atom. In this case, the content of the hydroxyl group is about 0 to 4.0 mass %, preferably 0.5 to 1.5 mass %, with respect to 100 g of the MQ resin. The MQ resin may further contain a relative low amount of an $R^{24}SiO_{3/2}$ unit (T unit) and an $R^{25}R^{26}SiO_{2/2}$ unit (D unit), where $R^{24}$, $R^{25}$, and $R^{26}$ represent a hydroxyl group or an unsubstituted or substituted monovalent hydrocarbon group having 1 to 10 carbon atoms. Illustrative examples thereof are the same as $R^{21}$, $R^{22}$, and $R^{23}$ describe above.

The above thermoplastic resin-modified organopolysiloxane may be dissolved in a solvent such as toluene, 5 to 20 parts by mass of hexamethyldisilazane may be added to 100 parts by mass of the organopolysiloxane, and the solution may be refluxed for 3 to 5 hours to change remaining hydroxyl groups into trimethylsiloxy groups. Furthermore, the obtained thermoplastic resin-modified organopolysiloxane may be dissolved in a rich solvent such as hexane and mixed with a poor solvent such as acetone in an amount of 1.5 to 3 times the total weight of the solution to use an organopolysiloxane precipitated in the lower layer.

The weight average molecular weight of the obtained resin-modified organopolysiloxane is 400,000 or more, preferably 550,000 or more, and 1,500,000 or less, preferably 1,200,000 or less.

D unit preferably constitutes 95.000 to 99.999 mol % of the resin.

The organopolysiloxane and the organopolysiloxane resin used for the reaction each may be one kind or a combination of two or more kinds. The thermoplastic resin-modified organopolysiloxane to be obtained may be one kind or two or more kinds.

The separation layer (C) containing a thermosetting silicone material suited to the room-temperature mechanical separation method is, for example, a thermosetting silicone separation layer containing components (C1) to (C3) and optionally containing component (C4) shown below:
(C1) an organopolysiloxane having two or more alkenyl groups per molecule;
(C2) an organohydrogenpolysiloxane having two or more silicon-bonded hydrogen atoms (Si—H groups) per molecule, in such an amount that a mole ratio of the Si—H group in the component (C2) to the alkenyl group in the component (C1) ranges from 0.3 to 10;
(C3) a platinum-based catalyst; and
(C4) a reaction retarder.

The component (C1) is an organopolysiloxane having two or more alkenyl groups per molecule. The component (C1) is preferably a linear or branched diorganopolysiloxane containing two or more alkenyl groups per molecule, particularly preferably a diorganopolysiloxane containing 0.3 to 10 mol %, particularly 0.6 to 9 mol % (mole of alkenyl group/mole of Si) of alkenyl groups per molecule.

Illustrative examples of such diorganopolysiloxane include compounds shown by the following general formula (8) and/or (9),

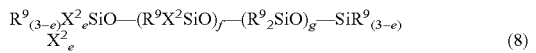

(8)

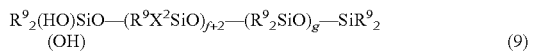

(9)

wherein $R^9$ independently represents a monovalent hydrocarbon group having no aliphatic unsaturated bond; $X^2$ independently represents a monovalent organic group containing an alkenyl group; and "e" is an integer of 0 to 3. In the formula (8), 2e+f is such a number that the content of alkenyl group is 0.3 to 10 mol % per molecule. In the formula (9), f+2 is such a number that the content of alkenyl group is 0.3 to 10 mol % per molecule. "f" is 0 or a positive number of 10 or less. "g" is a positive number of 1 to 1,000.

In the above formulae, $R^9$ is preferably a monovalent hydrocarbon group having 1 to 10 carbon atoms. Examples thereof include alkyl groups such as a methyl group, an ethyl group, a propyl group, and a butyl group; cycloalkyl groups such as a cyclohexyl group; and aryl groups such as a phenyl group and a tolyl group. In particular, alkyl groups such as a methyl group and a phenyl group are preferable.

$X^2$, a monovalent organic group having an alkenyl group, is preferably an organic group having 2 to 10 carbon atoms. Examples thereof include alkenyl groups such as a vinyl group, an allyl group, a hexenyl group, and an octenyl group; (meth)acryloylalkyl groups such as an acryloylpropyl group, acryloylmethyl group, and methacryloylpropyl group; (meth)acryloxyalkyl groups such as an acryloxypropyl group, an acryloxymethyl group, a methacryloxypropyl group, and a methacryloxymethyl group; and alkenyl group-containing monovalent hydrocarbon groups that optionally includes an oxygen atom such as a cyclohexenylethyl group and a vinyloxypropyl group. In particular, a vinyl group is industrially preferable.

In the general formula (8), "e" is an integer of 0 to 3, preferably 1 to 3. This preferable range allows terminals of the molecular chain to be blocked with alkenyl groups, and thus the reaction can be completed within a short time by the alkenyl groups with good reactivity at the terminal of the molecular chain. Furthermore, e=1 is industrially preferred in view of the cost. This alkenyl group-containing diorganopolysiloxane is preferably in an oil state or a crude rubber state. The alkenyl group-containing diorganopolysiloxane may be linear or branched.

The component (C2) is an organohydrogenpolysiloxane having two or more silicon-bonded hydrogen atoms (Si—H groups) per molecule, which serves as a crosslinker. The component (C2) has at least two, preferably 3 or more and 20 or less silicon-bonded hydrogen atoms (SiH groups) per molecule, and may have a linear, branched, or cyclic structure.

The component (C2), organohydrogenpolysiloxane, preferably has a viscosity at 25° C. of 1 to 5,000 mPa·s, more preferably 5 to 500 mPa·s, as measured by a rotational viscometer. The organohydrogenpolysiloxane may be a mixture of two or more kinds.

The component (C2) is preferably blended such that the mole ratio of the Si—H group in the component (C2) to the alkenyl group in the component (C1) (SiH group/alkenyl group) ranges from 0.3 to 10, particularly 1 to 8. When the mole ratio between the SiH group and the alkenyl group is 0.3 or more, crosslinking density is not decreased, and the problem of inability to cure the adhesive layer is not caused. When the mole ratio is 10 or less, the crosslinking density is not excessively increased, and sufficient viscosity and tackiness can be achieved. In addition, the mole ratio of 10 or less makes the available time of the solution to be treated longer.

The component (C3) is a platinum-based catalyst (i.e. platinum group metal catalyst). Examples thereof include chloroplatinic acid, an alcohol solution of chloroplatinic acid, a reaction product of chloroplatinic acid with alcohol, a reaction product of chloroplatinic acid with an olefin compound, and a reaction product of chloroplatinic acid with a vinyl group-containing siloxane.

The adding amount of the component (C3) is an effective amount, generally 1 to 5,000 ppm, preferably 5 to 2,000 ppm, in terms of (the mass of) platinum with respect to the total of (C1) and (C2) (if a later-described component (C4) is contained, the total of (C1), (C2), and (C4)). When the amount is 1 ppm or more, curability of the composition is not decreased, and crosslinking density and holding force are also not decreased. When the amount is 0.5% or less, available time of the solution to be treated can be prolonged.

The component (C4) is a reaction retarder, and is optionally added when the composition is prepared or applied to a base material to prevent the solution to be treated from thickening and gelling before heat curing.

Illustrative examples thereof include 3-methyl-1-butyn-3-ol, 3-methyl-1-pentyne-3-ol, 3,5-dimethyl-1-hexyne-3-ol, 1-ethynylcyclohexanol, 3-methyl-3-trimethylsiloxy-1-butyne, 3-methyl-3-trimethylsiloxy-1-pentyne, 3,5-dimethyl-3-trimethylsiloxy-1-hexyne, 1-ethynyl-1-trimethylsiloxycyclohexane, bis(2,2-dimethyl-3-butynoxy)dimethylsilane, 1,3,5,7-tetramethyl-1,3,5,7-tetravinylcyclotetrasiloxane, and 1,1,3,3-tetramethyl-1,3-divinyldisiloxane. Among them, 1-ethynylcyclohexanol and 3-methyl-1-butyn-3-ol are preferable.

If the component (C4) is contained in the composition, the formulation amount thereof is preferably 0.1 to 10 parts by mass, more preferably 0.1 to 8.0 parts by mass, much more preferably 0.1 to 2.0 parts by mass, based on 100 parts by mass of the total of the components (C1) and (C2). When the amount is 10 parts by mass or less, curability of the silicone adhesive composition is not decreased. When the amount is 0.1 part by mass or more, the effect of reaction retarder can be sufficiently exhibited.

The composition may further contain an organopolysiloxane having $R^{10}{}_3SiO_{0.5}$ units and $SiO_2$ units with $R^{10}{}_3SiO_{0.5}$ unit/$SiO_2$ unit mole ratio of 0.3 to 1.8, where $R^{10}$ independently represents a substituted or unsubstituted monovalent hydrocarbon group having 1 to 10 carbon atoms. The adding amount thereof is preferably 0 to 30 mass % of the component (C1). When this organopolysiloxane is contained, the amount thereof is preferably 1 to 30 mass %.

The resin materials or the composition may be dissolved in a solvent to form the thermoplastic organopolysiloxane separation layer, the thermoplastic resin-modified organopolysiloxane separation layer, or the thermosetting silicone separation layer by the spin coating, spray coating, slit coating, or film laminating method. In this case, hydrocarbon solvents such as pentane, hexane, cyclohexane, isooctance, nonane, decane, p-menthane, pinene, isododecane, and limonene are preferably used. In addition, a known antioxidant may be added to the separation layer (C) to improve heat resistance. Moreover, a filler such as silica may be added in an amount of 50 parts by mass or less based on 100 parts by mass of the component (C1) to further improve heat resistance.

Although the thickness of the separation layer (C) is not limited, the thickness is preferably 1 nm to 20 μm, more preferably 0.01 to 20 μm, particularly preferably 0.02 to 10 μm. When the thickness is in this range, a required process resistance can be obtained.

Illustrative examples of the aliphatic hydrocarbon material include the same examples as the aliphatic hydrocarbon resin used in the thermoplastic resin layer (A) described above. To the aliphatic hydrocarbon resin may be added thermoplastic silicone. Addition of thermoplastic silicone makes it easy to control the adhesive strength.

Illustrative examples of the aromatic hydrocarbon material include the same examples as the aromatic hydrocarbon resin used in the thermoplastic resin layer (A) described above. To the aromatic hydrocarbon resin may be added thermoplastic silicone. Addition of thermoplastic silicone makes it easy to control the adhesive strength.

Illustrative examples of the fluorine material include perfluoropolyether-modified alkoxysilane.

Illustrative examples of the separation layer (C) suited to the light laser separation method include a thermosetting naphthalene derivative separation layer that contains a resin having a repeating unit shown by the following formula (10) and a crosslinker for crosslinking the resin by thermal reaction,

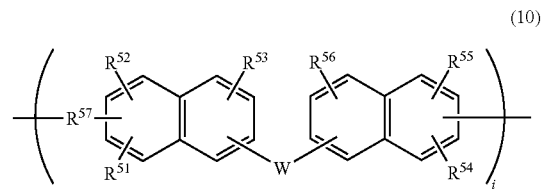

wherein $R^{51}$, $R^{52}$, $R^{53}$, $R^{54}$, $R^{55}$, and $R^{56}$ are the same or different and represent a hydrogen atom, a hydroxyl group, or a monovalent organic group having 1 to 20 carbon atoms, and $R^{51}$ to $R^{53}$ and $R^{54}$ to $R^{56}$ each have at least one hydroxyl group; $R^{57}$ represents a single bond or a divalent organic group having 1 to 20 carbon atoms; W represents a single bond or a divalent organic group having 1 to 30 carbon atoms; and "i" represents any natural number that leads to a weight average molecular weight of 100,000 or less.

Examples of raw material of the naphthalene (derivative) shown by the general formula (10) include 1-naphthol, 2-naphthol, 2-methyl-1-naphthol, 4-methoxy-1-naphthol, 7-methoxy-2-naphthol, 1,2-dihydroxynaphthalene, 1,3-dihydroxynaphthalene, 2,3-dihydroxynaphthalene, 1,4-dihydroxynaphthalene, 1,5-dihydroxynaphthalene, 1,6-dihydroxynaphthalene, 2,6-dihydroxynaphthalene, 1,7-dihydroxynaphthalene, 2,7-dihydroxynaphthalene, 1,8-dihydroxynaphthalene, 5-amino-1-naphthol, 2-methoxycarbonyl-1-naphthol, 1-(4-hydroxyphenyl) naphthalene, 6-(4-hydroxyphenyl)-2-naphthol, 6-(cyclohexyl)-2-naphthol, 1,1'-bi-2,2'-naphthol, 6,6'-bi-2,2'-naphthol, 9,9-bis(6-hydroxy-2-naphthyl)fluorene, 6-hydroxy-2-vinylnaphthalene, 1-hydroxymethylnaphthalene, and 2-hydroxymethylnaphthalene.

In the general formula (10), $R^{51}$, $R^{52}$, $R^{53}$, $R^{54}$, $R^{55}$, and $R^{56}$ are the same or different and represent a hydrogen atom, a hydroxyl group, or a monovalent organic group having 1 to 20 carbon atoms. Examples of the monovalent organic group include a methyl group, an ethyl group, an n-propyl group, an isopropyl group, an n-butyl group, a sec-butyl group, a tert-butyl group, an n-pentyl group, a neopentyl group, an n-hexyl group, an n-heptyl group, an n-octyl group, an n-nonyl group, an n-decyl group, an n-dodecyl group, an n-pentadecyl group, an n-icosyl group, a cyclopentyl group, a cyclohexyl group, a cyclopentylmethyl group, a cyclohexylmethyl group, a cyclopentylethyl group, a cyclohexylethyl group, a cyclopentylbutyl group, a cyclohexylbutyl group, an adamantyl group, a methoxy group, and a glycidyloxy group.

In the general formula (10), $R^{57}$ represents a single bond or a divalent organic group having 1 to 20 carbon atoms. Examples of the organic group represented by $R^{57}$ include an alkylene group, a phenylene group, a naphthylenyl group, an anthracenylene group, a norbornylene group, and divalent derivatives of phthalic acid; each group may have substituent such as alkyl, aryl, halogen, nitro, nitrile, and hydroxyl group.

In the general formula (10), W represents a single bond or a divalent organic group having 1 to 30 carbon atoms. Examples of the organic group represented by W include an alkylene group, a phenylene group, a naphthylenyl group, an anthracenylene group, a norbornylene group, and divalent derivatives of phthalic acid; each group may have substituent such as alkyl, aryl, halogen, nitro, nitrile, and hydroxyl group.

The molecular weight of the polymer shown by the general formula (10) in terms of polystyrene is preferably a weight average molecular weight (Mw) of 500 to 500,000, particularly preferably 1,000 to 100,000. The dispersibility of the molecular weight is preferably in the range of 1.2 to 20.

Examples of a crosslinker preferably used for the thermosetting naphthalene derivative separation layer include an epoxy compound and an epoxy resin having two or more functional groups per molecule, an amino resin such as methylol melamine, and a phenol compound.

Examples of the epoxy compound and resin include the same examples as the epoxy compound having a polyfunctional epoxy group to be added to the thermosetting composition mainly consisting of the thermosetting silicone-modified polymer of the general formula (1) and/or (3), described above.

The formulation amount of the epoxy crosslinker is 0.1 to 50 parts by mass, preferably 0.1 to 30 parts by mass, more preferably 1 to 30 parts by mass, based on 100 parts by mass of the resin of the general formula (10). The epoxy crosslinker may be used alone or in combination of two or more kinds.

When the above epoxy resin is used as the crosslinker, a curing accelerator is preferably added as a catalyst. The composition containing the epoxy resin curing accelerator enables the curing reaction to proceed suitably and uniformly.

Examples of the epoxy resin curing accelerator include imidazole compounds such as 2-methyl imidazole, 2-ethyl imidazole, 2-ethyl-4-methyl imidazole, an ethyl-isocyanate compound of these compounds, 2-phenyl imidazole, 2-phenyl-4-methyl imidazole, 2-phenyl-4-methyl-5-hydroxymethyl imidazole, and 2-phenyl-4,5-dihydroxymethyl imidazole; DBU compounds such as 1,8-diazabicyclo(5.4.0) undecene-7 (DBU), 1,5-diazabicyclo(4.3.0)nonene-5 (DBN), an organic acid salt of DBU, a phenol resin salt of DBU, and a tetraphenylborate of DBU derivatives; triorganophosphines such as triphenylphosphine, tributylphosphine, tris(p-methylphenyl)phosphine, tris(p-methoxyphenyl)phosphine, tris(p-ethoxyphenyl)phosphine, triphenylphosphine.triphenyl borate and tetraphenylphosphine.tetraphenyl borate; quaternary phosphonium salts; tertiary amines such as triethylene ammonium.triphenyl borate, and tetraphenylboric acid salts thereof. The epoxy resin curing accelerator may be used alone or in combination of two or more kinds.

The formulation amount of the epoxy resin curing accelerator is preferably 0.1 to 10 parts by mass, more preferably 0.2 to 5 parts by mass, based on 100 parts by mass of the resin of the general formula (10).

Examples of the amino resin used as the crosslinker include, in addition to methylol melamine, amino condensates modified with formalin or formalin-alcohol. Examples of the phenol compound used as the crosslinker include phenol compounds having on average two or more methylol groups or alkoxymethylol groups per molecule. Illustrative examples of these crosslinkers (the amino condensates and the phenol compounds) include the same examples as the crosslinker used for the phenol-group-containing silicone-modified thermosetting resin layer, which is an example of the thermosetting resin layer (B). These crosslinkers may be used alone or in combination of two or more kinds. The weight average molecular weight of the amino resin is preferably 150 to 10,000, particularly preferably 200 to 3,000.

The formulation amount of the amino resin is preferably 0.1 to 50 parts by mass, particularly preferably 1 to 30 parts by mass, based on 100 parts by mass of the resin of the general formula (10). The formulation amount of the phenol compound is preferably 0.1 to 50 parts by mass, particularly preferably 1 to 30 parts by mass, based on 100 parts by mass of the resin of the general formula (10).

When the amino resin such as methylol melamine is used as the crosslinker, a thermal acid generator is preferably added as a catalyst. The thermal acid generator may be for example, but is not particularly limited to, an ammonium salt shown by the following general formula (11),

$(S^-)(N^+(R^{62}R^{63}R^{64}R^{65}))$     (11)

wherein $R^{62}$, $R^{63}$, $R^{64}$, and $R^{65}$ each represent a hydrogen atom, a linear, branched, or cyclic alkyl group, alkenyl group, oxoalkyl group, or oxoalkenyl group having 1 to 12 carbon atoms, an aryl group having 6 to 20 carbon atoms, or an aralkyl group or aryloxoalkyl group having 7 to 12 carbon atoms, in which a part or all of hydrogen atoms in these groups may be substituted with alkoxy groups; $R^{62}$, $R^{63}$, $R^{64}$, and $R^{65}$ may form a ring together with the nitrogen atom bonded thereto; when the ring is formed, $R^{62}$, $R^{63}$, $R^{64}$, and $R^{65}$ form an alkylene group having 3 to 10 carbon atoms or a heteroaromatic ring having therein the nitrogen atom in the formula; S represents a sulfonic acid in which at least one α-position is fluorinated, a perfluoroalkyl imidic acid, or perfluoroalkyl methide acid.

Illustrative examples of $S^-$ include perfluoroalkanesulfonic acid such as triflate and nonaflate; sulfonate in which at least one α-position is fluorinated; imidic acids such as bis(trifluoromethylsulfonyl)imide, bis(perfluoroethylsulfonyl)imide, and bis(perfluorobutylsulfonyl)imide; and methide acids such as tris(trifluoromethylsulfonyl)methide and tris(perfluoroethylsulfonyl)methide.

The adding amount of the thermal acid generator is preferably 0.1 to 15 parts by mass, particularly preferably 0.1 to 10 parts by mass, based on 100 parts by mass of the resin of the general formula (10).

When the thermosetting naphthalene derivative separation layer is formed by the spin coating, spray coating, slit coating, or film laminating method, the composition may be dissolved in a solvent. In this case, examples of the solvent include ketones such as cyclohexanone, cyclopentanone, and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxy propionate, tert-butyl acetate, tert-butyl propionate, propylene glycol mono-tert-butyl ether acetate, and γ-butyrolactone. These solvents may be used alone or in combination of two or more kinds.

The thermosetting naphthalene derivative separation layer is preferably such thick that 85% or more of light having wavelength of 500 nm or less can be intercepted. The thickness preferably ranges from 0.1 μm to 30 μm, more preferably from 0.3 μm to 20 μm. When the thickness is 0.1 μm or more, the light can be sufficiently intercepted. When the thickness is 30 μm or less, the layer can have good flatness.

In addition, a known antioxidant may be added in an amount of 0.5 to 5 parts by mass, preferably 1 to 3 parts by mass, and a filler such as silica may be added in an amount of 50 parts by mass or less, based on 100 parts by mass of the resin of the general formula (10) to improve heat resistance. Moreover, a surfactant may be added to improve coating uniformity. Illustrative examples of the antioxidant that can be added include hindered phenol compounds such as tetrakis[methylene-(3,5-di-tert-butyl-4-hydroxyhydrocinnamate)]methane (product name: Adekastab AO-60). The compounds may be used in combination of two or more kinds thereof.

The thermosetting naphthalene derivative separation layer is formed as a composition and then thermally cured before processing the wafer. The curing reaction can be progressed with a usual hot plate or oven. The reaction temperature is typically 100° C. to 350° C., preferably 150° C. to 300° C. The curing reaction may be performed before producing the wafer processing laminate, or after forming the wafer processing laminate by heating the entire wafer processing laminate. In the latter case, the separation layer may be thermally cured in the step (b) (the step of heat curing the thermosetting resin layer (B)) in the method for processing a wafer, described later.

A method for laminating the separation layer (C) is not particularly limited. For example, spin coating, spray coating, slit coating, film laminating, and vacuum deposition methods are preferably employed. These methods enable lamination without gaps between adjacent layers. The separation layer (C) may be formed on the circuit wafer on which thermoplastic resin layer (A) and the thermosetting resin layer (B) are laminated, or the support. Although any of them can be selected, the separation layer (C) is preferably laminated on the support.

—Cleaning Liquid (D)—

The cleaning liquid (D) is not particularly limited as long as the liquid can dissolve the thermoplastic resin layer (A) as well as cannot dissolve the thermosetting resin layer (B) but can swell and permeate into the layer (B) after heat curing. Examples of the cleaning liquid include an aliphatic hydrocarbon solvent, an aromatic hydrocarbon solvent, a ketone solvent, an alcohol solvent, an ether solvent, an ester solvent, an amine solvent, an ammonium solvent, and an organic acid solvent.

Illustrative examples of the cleaning liquid (D) include aliphatic hydrocarbon solvents such as pentane, hexane, cyclohexane, isooctane, nonane, decane, p-menthane, pinene, isododecane, and limonene; aromatic hydrocarbon solvents such as toluene and xylene; ketone solvents such as cyclohexanone, cyclopentanone, and methyl-2-n-amyl ketone; alcohol solvents such as 3-methoxybutanol, 3-methyl-3-methoxybutanol, 1-methoxy-2-propanol, and 1-ethoxy-2-propanol; ether solvents such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; ester solvents such as propylene glycol monomethyl ether acetate, propylene glycol monoethyl ether acetate, ethyl lactate, ethyl pyruvate, butyl acetate, methyl 3-methoxypropionate, ethyl 3-ethoxy propionate, tert-butyl acetate, tert-butyl propionate, propylene glycol mono-tert-butyl ether acetate, and γ-butyrolactone; amine solvents such as ethanolamine, diethanolamine, triethanolamine, and triethylamine; ammonium solvents such as alcohol solution or glycol solution of ammonium, tetramethylammonium, tetraethylammonium, or tetrabutylammonium; and organic acid solvents such as a liquid in which acetic acid, oxalic acid, benzenesulfonic acid, or dodecylbenzenesulfonic acid is dissolved.

The organic solvent may be one kind or a combination of two or more kinds. When the organic solvents are used in combination, a mixed solution containing p-menthane and propylene glycol monoethyl ether acetate, a mixed solution containing p-menthane and propylene glycol monomethyl ether acetate, and a mixed solution containing isononane and cyclopentanone are preferably used.

The cleaning liquid may be a mixed solution containing the organic solvent and one or more liquids selected from a basic aqueous solution, an acidic aqueous solution, and water. Examples of the basic aqueous solution include an aqueous solution containing ammonium, tetramethylammonium, tetraethylammonium, or tetrabutylammonium. Examples of the acidic aqueous solution include an aqueous solution containing hydrochloric acid, sulfuric acid, nitric acid, acetic acid, or oxalic acid. Also in this case, the organic solvent may be one kind or a combination of two or more kinds.

The above cleaning liquid (D) facilitates the dissolution of the thermoplastic resin layer (A) and the separation of the thermosetting resin layer (B) without damaging the front surface of the circuit wafer.

When the thermoplastic resin layer (A) is a hydrocarbon resin, a hydrocarbon solvent is preferably used to dissolve the thermoplastic resin layer (A). However, a single hydrocarbon solvent can have low permeability to the thermosetting resin layer (B). Thus, a polar solvent such as propylene glycol monomethyl ether acetate is preferably added to the solvent to achieve both permeability to the thermosetting resin layer (B) and dissolution of the thermoplastic resin layer (A).

The thermoplastic resin layer (A) soluble in the cleaning liquid (D) means that when the thermoplastic resin layer (A) on the wafer is treated with the cleaning liquid (D), the thermoplastic resin layer (A) can be removed without residual solid. The amount and the treatment method of the cleaning liquid (D) are not limited as long as the thermoplastic resin layer (A) can be removed without residual solid. Generally, 1 part by mass of the thermoplastic resin layer (A) is treated with 0.1 to 100,000 parts, preferably 100 to 10,000 parts of the cleaning liquid (D).

The thermosetting resin layer (B) insoluble in the cleaning liquid (D) means that when the thermosetting resin layer (B) is treated with the cleaning liquid (D) with sufficient amount and method to remove the thermoplastic resin layer (A) without residual solid, the thermosetting resin layer (B) can remain as an independent film. Generally, the treatment with the cleaning liquid (D) reduces the weight of the thermosetting resin layer (B) by 80 mass % or less, preferably 50 mass % or less, more preferably 20 mass % or less.

[Wafer and Support]

—Circuit Wafer—

The wafer that has a front surface on which a circuit is formed and a back surface to be processed is a circuit wafer, one of the surfaces of which is a circuit-forming surface and the other surface of which is a non-circuit-forming surface. The circuit wafer to which the present invention can be applied is typically a semiconductor wafer. Examples of the semiconductor wafer include not only a silicon wafer, but also a germanium wafer, a gallium-arsenic wafer, a gallium-phosphorus wafer, and a gallium-arsenic-aluminum wafer. The thickness of the wafer is typically, but not particularly limited to, 600 to 800 μm, more typically 625 to 775 μm.

—Support—

As the support, substrates such as a silicon wafer, a glass substrate, and a quartz substrate that are compatible with the process are usually used without any limitation. Especially when the separation layer (C) uses the material suited to the light laser separation method, the support preferably has transmittance with respect to wavelength of light to be used; a glass substrate is particularly preferably used. When the separation layer (C) does not use the material suited to the light laser separation method, light transmittance is not limited; a silicon wafer is particularly preferably used.

[Method for Processing Wafer]

The inventive method for processing a wafer is characterized by using, as a temporary adhesive material layer between the semiconductor circuit wafer and the support, the temporary adhesive material layer including the first temporary adhesive layer composed of the thermoplastic resin layer (A) and the second temporary adhesive layer composed of the thermosetting resin layer (B). The thermoplastic resin layer (A) is soluble in the cleaning liquid (D) even after processing the wafer. The thermosetting resin layer (B) is insoluble in the cleaning liquid (D) after heat curing and capable of absorbing the cleaning liquid (D) such that the cleaning liquid (D) permeates into the layer (B). As described previously, the temporary adhesive material layer may further include the third temporary adhesive layer composed of the separation layer (C). The thickness of a thin wafer obtained by the inventive method for processing a wafer is typically 5 to 300 µm, more typically 10 to 100 µm.

The inventive method for processing a wafer has the steps (a) to (g), and optionally has the steps (h) to (j), if necessary.

—Step (a)—

Step (a) is a step of bonding the support and the front surface of the circuit wafer with the temporary adhesive material layer to produce a wafer processing laminate.

The structure of each temporary adhesive material layer and the method for laminating each temporary adhesive material layer are as described above in the section of the temporary adhesive material layer.

When materials of each temporary adhesive material layer are dissolved in a solvent to form the layer on the circuit wafer by spin coating, the layer is prebaked at 80 to 200° C. after spin coating, depending on the volatile conditions of the used solvent, and then used.

A method for bonding the front surface of the circuit wafer and the support with the temporary adhesive material layer is not limited. In the case that the temporary adhesive material layer does not include the separation layer (C), the circuit wafer on which the thermoplastic resin layer (A) is laminated may be bonded to the support on which the thermosetting resin layer (B) is laminated. In the case that the temporary adhesive material layer includes the separation layer (C), the circuit wafer on which the thermoplastic resin layer (A) and the thermosetting resin layer (B) are laminated may be bonded to the support on which the separation layer (C) is laminated. At this time, the wafer processing laminate is uniformly compressed under reduced pressure at a temperature in the range of preferably 40 to 200° C., more preferably 60 to 180° C. to bond the wafer and the support via the temporary adhesive material layer.

Examples of a wafer-bonding apparatus include a commercially available wafer-bonding apparatus such as EVG520IS and 850 TB manufactured by EV Group, and XBC300 manufactured by SUSS MicroTec AG.

—Step (b)—

Step (b) is a step of heat curing the thermosetting resin layer (B). After the wafer processing laminate is formed, the wafer processing laminate is heated at 120 to 220° C., preferably 150 to 200° C., for 10 minutes to 4 hours, preferably 30 minutes to 2 hours, to cure the thermosetting resin layer (B). When a thermosetting separation layer (C) is used, the separation layer (C) may be cured in this step.

—Step (c)—

Step (c) is a step of grinding or polishing the back surface of the wafer bonded to the support, i.e., a step of grinding or polishing the wafer processing laminate from the wafer back surface side to reduce the thickness of the wafer. The technique for grinding the wafer back surface is not particularly limited, and known grinding techniques may be used. The grinding is preferably performed while water is fed to the wafer and a grinding wheel (e.g. diamond) for cooling. Examples of an apparatus for grinding the wafer back surface include DAG-810 (product name) manufactured by DISCO Co., Ltd. The wafer back surface side may be subjected to CMP polishing.

—Step (d)—

Step (d) is a step of processing the back surface of the wafer which has been ground, i.e., the back surface of the wafer which has been thinned by grinding the back surface. The step of processing the wafer after grinding the wafer back surface includes various processes applied in the wafer level. Examples thereof include wafer surface treatment, electrode formation, metal wiring formation, and protective film formation. More specifically, well-known processes may be mentioned, including CVD for wafer surface treatment, laser annealing, metal sputtering for forming electrodes and so on, vapor deposition, wet etching for etching a sputtered metal layer, patterning process in which a resist is applied and subjected to exposure and development to form a pattern used as a mask for metal wiring formation, resist removal, dry etching, formation of a metal plating, formation of an organic film for protecting the surface, silicon etching to form a TSV, and formation of an oxide film on silicon surface. In these processes, the wafer processing laminate desirably has a wide range of resistance to high temperature up to about 400° C. In particular, the wafer processing laminate preferably exhibits strength and lifetime even at 300° C. or higher.

—Step (e)—

Step (e) is a step of removing or separating the support from the wafer processing laminate after processing the back surface of the circuit wafer in the step (d). A method for removing or separating the support from the wafer processing laminate is not particularly limited. In the case that the separation layer (C) is not included and the thermosetting resin layer (B) firmly adheres to the support, grinding of the support or the light laser separation method is preferably employed. In the case that the separation layer (C) is not included and the thermosetting resin layer (B) is controlled to releasably adhere to the support, the room temperature mechanical separation method is preferably employed. In the case that the separation layer (C) suited to the room temperature mechanical separation method is included, the room temperature mechanical separation method is preferably employed. In the case that the separation layer (C) suited to the light laser separation method is included, the light laser separation method is preferably employed. These methods enable the support to be removed or separated without damaging the processed circuit wafer.

The support can be ground for removal by the same method as the back surface of the circuit wafer is ground in the step (c). However, the support does not require mirror-polishing and CMP process unlike the back surface grinding since even just removing the support would be enough.

The room temperature mechanical separation method to separate the support is generally carried out at room temperature. Examples of this method include a mechanical separation method in which either the circuit wafer or the support of the wafer processing laminate is horizontally fixed, and the other is lifted at a certain angle with respect to the horizontal direction; or a peeling method in which a protective film is bonded to the ground surface of the wafer, and then the wafer and the protective film are separated from the wafer processing laminate. If necessary, heating may be performed at lower than about 100° C. In addition, this step preferably includes the steps of:

(h) bonding a dicing tape to the processed surface (back surface) of the processed circuit wafer;
(i) attaching the dicing tape surface by vacuum suction to a suction surface; and
(j) separating the support from the wafer processing laminate by peeling-off at a temperature of the suction surface in the range of 10° C. to 100° C. These steps enable the support to be easily separated from the wafer processing laminate, and facilitate a subsequent dicing step. The dicing tape may be a known tape using, for example, polyester or polyethylene film.

The light laser separation method to separate the support can be performed by the following procedure. For example, the wafer processing laminate is plane-irradiated or laser-irradiated with X-rays, ultraviolet rays, visible rays, infrared rays, or light having wavelengths within a specific range from the support side to deteriorate the thermosetting resin layer (B) and thus decrease one or more of adhesive strength between the support and the thermosetting resin layer (B), adhesive strength between the thermosetting resin layer (B) and the separation layer (C), and cohesive failure strength of the thermosetting resin layer (B). The support can be thereby separated from the wafer processing laminate. The thermosetting resin layer (B) can be adapted to the light laser separation method by selecting the wavelength of light to be emitted. Moreover, the support can be separated from the wafer processing laminate by deteriorating the separation layer (C) and decreasing, for example, the adhesive strength between the support and the separation layer (C) through the laser irradiation. In this case, the support preferably transmits light or laser with wavelength to be used so that the light or the laser reaches the thermosetting resin layer (B) or the separation layer (C). The transmittance is preferably 50% or more, more preferably 70% or more, much more preferably 85% or more. Alternatively, the following separation method is also preferably employed: a light-intercepting layer is provided on the support, the light-intercepting layer is irradiated with mainly laser and thereby heated, the thermosetting resin layer (B) or the separation layer (C) is deteriorated by the heat to decrease the adhesive strength for separation.

—Step (f)—

Step (f) is a step of, after removing or separating the support from the wafer processing laminate in the step (e), simultaneously performing dissolution of the remaining thermoplastic resin layer (A), separation of the thermosetting resin layer (B), and if the separation layer (C) exists, dissolution or separation of the separation layer (C) with the cleaning liquid (D) in order to take out the circuit wafer. The treatment in this step is generally carried out at room temperature, but if necessary, heat treatment may be performed at a temperature lower than 100° C. The treatment procedure with the cleaning liquid (D) is not particularly limited. For example, the following method is preferably employed: the wafer processing laminate, from which the support has been removed or separated, attached to the dicing tape is immersed in the cleaning liquid (D), or the wafer processing laminate is filled, sprayed with, or continuously exposed to the flow of the cleaning liquid (D) for preferably 30 seconds to 1 hour, more preferably 1 to 10 minutes such that the cleaning liquid (D) permeates into the thermosetting resin layer (B), the underlying thermoplastic resin layer (A) is then dissolved in the permeating cleaning liquid (D). The thermosetting resin layer (B) is thus separated without damaging the circuit wafer while the thermoplastic resin layer (A) remaining on the circuit wafer is dissolved in the cleaning liquid (D). In the case that the separation layer (C) soluble in the cleaning liquid (D) is present, cleaning treatment is continuously performed. In the case that the separation layer (C) insoluble in the cleaning liquid (D) is present, the layer (C) is separated together with the thermosetting resin layer (B). The separated thermosetting resin layer (B) and separation layer (C) can be removed by spinning the wafer, or physically taking out the wafer.

—Step (g)—

Step (g) is a step of taking out the circuit wafer alone after the temporary adhesive material layer is removed or separated in the step (f). The method for taking out the circuit wafer alone is not particularly limited. This step generally follows the step (f). The circuit wafer is rinsed with a rinsing liquid such that residue does not remain on the circuit wafer. The rinsing liquid is removed from the circuit wafer by, for example, spin drying. The circuit wafer attached to the dicing tape can thus be taken out. The rinsing liquid may be any liquid that can remove the residue from the circuit wafer by, for example, spin drying, and is preferably a solvent having a relatively high volatility and a low boiling point. For example, hydrocarbon solvents such as isononane, alcohol solvents such as isopropyl alcohol (IPA), and water are preferably used. If the cleaning liquid (D) does not cause residue after evaporation, the cleaning liquid (D) may be used instead of the rinsing liquid.

EXAMPLES

In the following, the present invention will be specifically described with reference to Examples and Comparative Examples, but the present invention is not limited to these Examples.

Resin Synthesis Example 1

A flask equipped with a stirrer, a thermometer, a nitrogen purge system, and a reflux condenser was charged with 43.1 g of 9,9'-bis(3-allyl-4-hydroxyphenyl)fluorene (M-1), 29.5 g of organohydrogensiloxane shown by the average structural formula (M-3), 135 g of toluene, and 0.04 g of chloroplatinic acid, and the mixture was heated at 80° C. Then, 17.5 g of 1,4-bis(dimethylsilyl)benzene (M-5) was added dropwise into the flask over 1 hour. At this time, the temperature inside the flask was increased to 85° C. After completion of dropwise addition, the mixture was aged at 80° C. for 2 hours, toluene was then distilled off, and 80 g of cyclohexanone was added thereto to obtain a resin solution (b1) containing cyclohexanone as a solvent with a concentration of the resin solid of 50 mass %. When the molecular weight of the resin in the solution was measured by GPC, the weight average molecular weight was 45,000 in terms of polystyrene.

Resin Synthesis Example 2

In a 5-L flask equipped with a stirrer, a thermometer, a nitrogen purge system, and a reflux condenser, 84.1 g of epoxy compound (M-2) was dissolved in 600 g of toluene. Then, 294.6 g of compound (M-3) and 25.5 g of compound (M-4) were added to the solution, and the mixture was heated at 60° C. Thereafter, 1 g of carbon carried platinum catalyst (5 mass %) was added thereto, and after confirming that the internal reaction temperature was increased to 65 to 67° C., the mixture was further heated to 90° C. and aged for 3 hours. Then, the mixture was cooled to room temperature, and 600 g of methyl isobutyl ketone (MIBK) was added thereto. This reaction solution was filtered under pressure through a filter to remove the platinum catalyst. The solvent in the resin solution was distilled off under reduced pressure, and 270 g of propylene glycol monomethyl ether acetate (PGMEA) was added thereto to obtain a resin solution (b2) containing PGMEA as a solvent with a concentration of the solid component of 60 mass %. When the molecular weight of the resin in the resin solution was measured by GPC, the weight average molecular weight was 28,000 in terms of polystyrene.

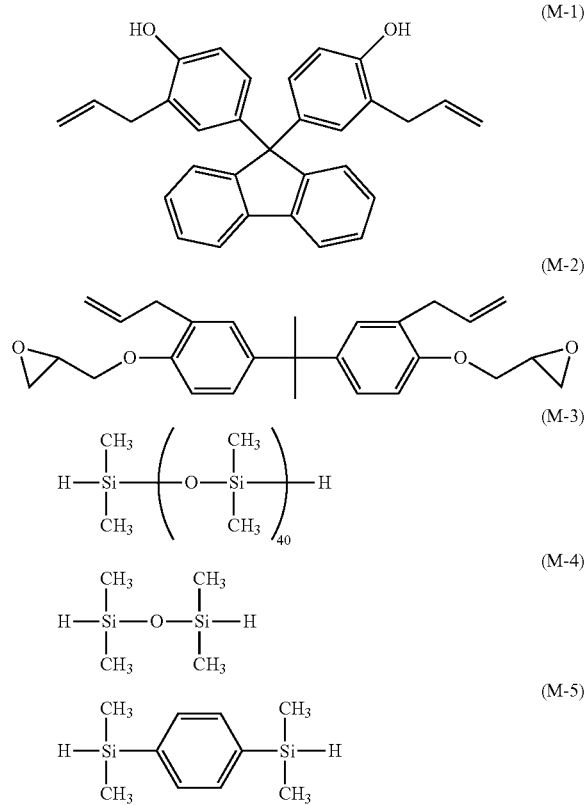

(M-1)
(M-2)
(M-3)
(M-4)
(M-5)

Resin Synthesis Example 3

A four-necked flask was charged with 1,000 g (3.38 mol) of octamethylcyclotetrasiloxane and 0.93 g (0.003 mol) of tris(trimethylsiloxy)methylsilane, and the mixture was maintained at 110° C. Then, 4 g of 10 mass % tetrabutyl phosphonium hydroxide siliconate was added to the mixture. After polymerization over 4 hours, a post-treatment was carried out at 160° C. for 2 hours to obtain dimethylpolysiloxane.

The obtained dimethylpolysiloxane was analyzed by $^{29}$Si-NMR method to determine the ratio of D unit, M unit, and T unit, and consequently identified as a branched dimethylpolysiloxane having the following structure containing 99.911% of D unit, 0.067% of M unit, and 0.022% of T unit.

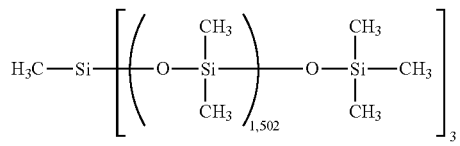

500 g of the branched dimethylpolysiloxane was dissolved in 500 g of hexane, the solution was then added to 2 L of acetone, and the precipitated resin was collected. Thereafter, hexane, etc., were removed under vacuum to obtain a dimethylpolysiloxane polymer (c1) having a weight average molecular weight of 400,000 and containing 0.07 mass % of a low molecular weight component having a molecular weight of 740 or less.

Resin Synthesis Example 4

In a four-necked flask, 90 parts of a crude rubber state dimethylpolysiloxane (corresponding to the general formula (7), where "n" is 9,000) both molecular terminals of which are sealed with hydroxyl groups and a 30% toluene solution of which has a viscosity at 25° C. of 98,000 mPa·s, and 10 parts of methylpolysiloxane resin composed of 0.75 mol of $(CH_3)_3SiO_{1/2}$ unit and 1 mol of $SiO_{4/2}$ unit and containing 1.0 mol % of hydroxyl group per 100 parts of the solid component were dissolved in 900 parts of toluene. To the obtained solution was added 1 part of 28% aqueous ammonia, and the mixture was subjected to condensation reaction under stirring at room temperature for 24 hours. Then, the resulting mixture was heated to 180° C. under reduced pressure, and toluene, condensed water, ammonia, etc., were removed therefrom to obtain a solidified partially condensate. 900 parts of toluene was added to 100 parts of the partially condensate to dissolve the condensate. To the solution was added 20 parts of hexamethyldisilazane, and the mixture was stirred at 130° C. for 3 hours to seal the remaining hydroxyl groups. Subsequently, the mixture was heated to 180° C. under reduced pressure, and the solvent was removed to obtain a solidified non-reactive partially condensate. Moreover, after adding 900 parts of hexane to 100 parts of the non-reactive partially condensate to dissolve the condensate, this solution was added to 2000 parts of acetone, and the precipitated resin was collected. Thereafter, hexane, etc., were removed under vacuum to obtain a dimethylpolysiloxane polymer (c2) having a weight average molecular weight of 900,000 and containing 0.05 mass % of a low molecular weight component having a molecular weight of 740 or less.

Resin Synthesis Example 5

A 1,000-ml flask was charged with 80 g (0.50 mol) of compound (M-6), 1,5-dihydroxynaphtalene, 51.6 g (0.30 mol) of compound (M-7), 2-hydroxy-6-naphthoaldehyde, and 145 g of methyl cellosolve. To the mixture was added 20 g of a methyl cellosolve solution containing 20 mass % p-toluenesulfonic acid under stirring at 70° C. The temperature was increased to 85° C., and the mixture was stirred for 6 hours. The mixture was then cooled to room temperature, and diluted with 800 ml of ethyl acetate. The diluted solution was transferred to a separatory funnel, and washed with 200 ml of deionized water to remove the reaction catalyst and metal impurities. The obtained solution was concentrated under reduced pressure, 600 ml of ethyl acetate was added to the residue, and a polymer was precipitated by 2,400 ml of hexane. The precipitated polymer was collected by filtration and dried under reduced pressure to obtain a polymer (c3) having a repeating unit shown by the following structural formula. The molecular weight (Mw) and the dispersity (Mw/Mn) were measured by GPC, and the ratio in the polymer was measured by $^1$H-NMR analysis, as shown below.

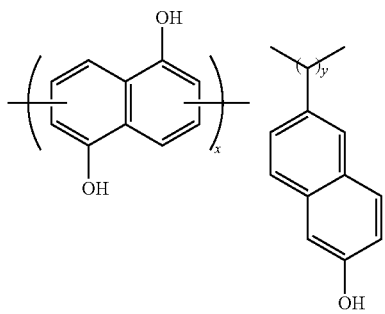

x/(x+y)=0.59
Molecular weight (Mw) 3,200
Dispersity (Mw/Mn)=2.44

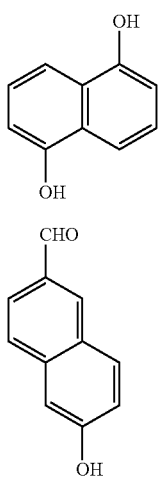

(M-6)

(M-7)

Solution Production Example 1

24 g of a hydrogenated polystyrene-based thermoplastic resin, SEPTON4033 (available from Kuraray Co., Ltd.), was dissolved in 176 g of p-menthane to obtain a p-menthane solution containing 12 mass % SEPTON4033. The obtained solution was filtered through a 0.2-μm membrane filter to obtain a p-menthane solution of the thermoplastic resin (A-1).

Solution Production Example 2

50 g of the resin solution (b1) was mixed with 7.5 g of an epoxy crosslinker, EOCN-1020 (available from NIPPON KAYAKU Co., Ltd.) as a crosslinker, 0.2 g of BSDM (bis(tert-butylsulfonyl)diazomethane) available from Wako Pure Chemical Industries Ltd., as a curing catalyst, and 0.1 g of tetrakis[methylene-(3,5-di-tert-butyl-4-hydroxyhydrocinnamate)]methane (product name: Adekastab AO-60) as an antioxidant. The solution was filtered through a 0.2-μm membrane filter to obtain a thermosetting resin solution (B-1).

Solution Production Example 3

100 g of the resin solution (b2) was mixed with 9 g of a tetra-functional phenol compound, TEP-TPA (available from Asahi Organic Chemicals Industry Co., Ltd.), and 0.2 g of tetrahydrophthalic anhydride (RIKACID HH-A, available from New Japan Chemical Co., Ltd.). The solution was then filtered through a 0.2-μm membrane filter to obtain a thermosetting resin solution (B-2).

Solution Production Example 4

0.5 g of the polymer (c1) was dissolved in 100 g of isododecane. The solution was filtered through a 0.2-μm membrane filter to obtain an isododecane solution containing the dimethylpolysiloxane polymer (C-1).

Solution Production Example 5

1.0 g of the polymer (c2) was dissolved in 100 g of isododecane. The solution was filtered through a 0.2-μm membrane filter to obtain an isododecane solution containing the dimethylpolysiloxane polymer (C-2).

Solution Production Example 6

To a solution consisting of 80 parts of polydimethylsiloxane having 0.5 mol % vinyl groups at molecular side chains with a number average molecular weight (Mn) of 30,000 and 400 parts of isododecane were added 5.0 parts of organohydrogenpolysiloxane shown by the formula (M-8) and 0.7 part of ethynylcyclohexanol, and then mixed. The mixture was further mixed with 0.5 part of a platinum catalyst CAT-PL-5 (available from Shin-Etsu Chemical Co., Ltd.) and filtered through a 0.2-μm membrane filter to obtain a thermosetting siloxane composition solution (C-3).

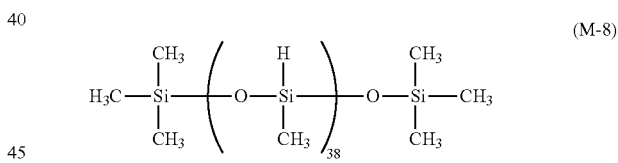

(M-8)

Solution Production Example 7

20 parts by mass of the polymer (c3), 1 part by mass of an acid generator AG1 shown below, and 4 parts by mass of a crosslinker, NIKALAC MW-390 (available from Sanwa Chemical Co., Ltd.), were dissolved in 100 parts by mass of PGMEA containing 0.1 mass % FC-430 (available from Sumitomo 3M Inc.). The solution was filtered through a 0.1-μm filter made of a fluorinated resin to prepare a resin solution (C-4).

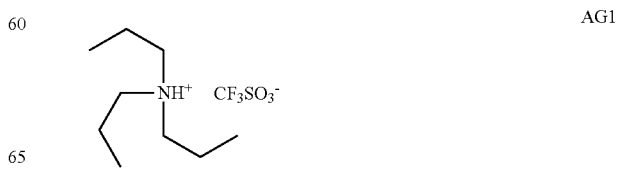

AG1

Examples 1 to 5 and Comparative Examples 1 and 2

Onto a 200-mm diameter silicon wafer (thickness: 725 μm) whose entire surface was formed with copper posts having height of 10 μm and diameter of 40 μm, the resin solution (A-1) was applied by spin coating except for Comparative Example 1, and then heated with a hot plate at 180° C. for 5 minutes to form a layer corresponding to the layer (A) on the bump-formed surface of the wafer. On the other hand, a 200-mm bare silicon wafer (thickness: 725 μm) was prepared as the support in Examples 1 to 4 and Comparative Examples 1 and 2, and a 200-mm diameter glass plate (thickness: 500 μm) was prepared as the support in Example 5. In Example 1 and Comparative Example 1, the solution corresponding to the layer (B) was applied to the support by spin coating, and the support was heated on a hot plate at 150° C. for 3 minutes to semi-cure the layer (B). In Examples 2 to 5, the solution corresponding to the layer (C) was applied by spin coating. The support was then heated on a hot plate at 180° C. for 5 minutes in Examples 2 to 4, at 250° C. for 5 minutes in Example 5. In Examples 2 to 5, the solution corresponding to the layer (B) was further applied to the layer (C) by spin coating, and the support was heated on a hot plate at 150° C. for 3 minutes to semi-cure the layer (B). The silicon wafer and the glass plate thus obtained were bonded so that their resin surfaces faced each other in a vacuum bonding apparatus under the conditions shown in Table 1. A laminate (wafer processing laminate) was thereby manufactured. Table 1 shows thicknesses of the layers (A), (B), and (C). The thicknesses of the layers (A), (B), and (C) were determined by measuring thicknesses of respective films that were formed on a 200-mm bare Si wafer by spin coating under the same condition, with a spectrometric film-thickness measurement system (VM-1210 manufactured by Dainippon Screen Mfg. Co., Ltd.).

Thereafter, the bonded substrate was subjected to the following tests. The results of Examples and Comparative Examples are shown in Table 1. In addition, evaluations were carried out in order described below. When the result became anomaly (the judgment is "poor") during the tests, the evaluation thereafter was stopped, and showed with "-".

—Adhesion Test—

The 200-mm wafer was bonded with a wafer-bonding apparatus EVG520IS manufactured by EV group. The bonding was carried out at adhesion temperature shown in Table 1, under a chamber internal pressure during bonding of $10^{-3}$ mbar or less, with a load of 5 kN. After bonding, the substrate was once heated with an oven at 180° C. for 1 hour to cure the layer (B). The substrate was then cooled to room temperature, and adhesion state of its interface was observed by Scanning Acoustic Tomograph (SAT, FineSAT300, manufactured by Hitachi, Ltd.). When no abnormality such as separation was found at the interface, the specimen was evaluated as good, and shown with "good". When an abnormality was found, the specimen was evaluated as poor, and shown with "poor".

—Back Surface Grinding Resistance Test—

The back surface of the silicon wafer with copper posts was ground by a grinder (DAG810, manufactured by DISCO Co., Ltd.) with a diamond grinding wheel. After the wafer was ground to a final substrate thickness of 50 μm, abnormities such as crack and separation were checked with an optical microscope (100-folds). When no abnormality was found, the specimen was evaluated as good, and shown with "good". When an abnormality was found, the specimen was evaluated as poor, and shown with "poor".

—Heat Resistance Test—

After the back surface of the silicon wafer with copper posts had been ground, the laminate was placed in an oven under nitrogen atmosphere at 200° C. for 2 hours, followed by heating with a hot plate at 250° C. for 10 minutes. Then, abnormalities in appearance of the laminate were checked. When no appearance abnormality was found, the specimen was evaluated as good, and shown with "good". When appearance abnormality such as voids and swelling of the wafer occurred, the specimen was shown with "poor".

—Support Separation Test—

In Example 1 and Comparative Example 1, the bare silicon wafer on the support side was ground by a grinder (DAG810, manufactured by DISCO Co., Ltd.) with a diamond grinding wheel until the support disappeared. In Examples 2 to 5, a dicing tape was bonded to the processed surface (non-circuit-forming surface) side of the wafer that had been thinned to 50 μm and subjected to the heat resistance test, with a dicing frame. This dicing tape surface was set to a suction plate by vacuum suction. Then, in Example 5, the entire wafer surface was irradiated from the support side with laser having wavelength of 400 nm. In Examples 2 to 5, one point of the support was lifted by tweezers at room temperature to separate the support. When the support could be ground or separated without cracking the 50 μm wafer, the specimen was shown with "good". When an abnormality such as crack occurred, the specimen was evaluated as poor, and shown with "poor".

—Cleaning Removability Test—

After the support separation test, the wafer attached to the dicing frame was set on a spin coater, with the adhesive layer upside. 100 ml of a cleaning liquid (D-1) containing p-menthane and propylene glycol monomethyl ether acetate with a p-menthane to propylene glycol monomethyl ether acetate mass ratio of 7:3 was dropped on the wafer, and the wafer was left to stand for 5 minutes. The layer (B) was thereby swollen and separated from the wafer processing laminate. After the separated layer (B) was removed, 50 ml of the cleaning liquid (D-1) was further dropped on the wafer, and the wafer was left to stand for 2 minutes to completely dissolve the layer (A). The wafer was then rinsed by spraying isopropyl alcohol (IPA) while rotating the wafer for 30 seconds. The wafer surface was dried by nitrogen blowing. Thereafter, appearance of the wafer was observed to check the presence of a residue of the adhesive material resin by naked eye. When no resin remained, the specimen was evaluated as good, and shown with "good". When the resin remained, the specimen was evaluated as poor, and shown with "poor".

TABLE 1

| | | Example 1 | Example 2 | Example 3 | Example 4 | Example 5 | Comparative Example 1 | Comparative Example 2 |
|---|---|---|---|---|---|---|---|---|
| Manufacturing conditions | Sample of layer (A) | A-1 | A-1 | A-1 | A-1 | A-1 | none | A-1 |
| | Thickness of | 10 μm | 10 μm | 10 μm | 10 μm | 10 μm | — | 10 μm |

TABLE 1-continued

|  |  | Example 1 | Example 2 | Example 3 | Example 4 | Example 5 | Comparative Example 1 | Comparative Example 2 |
|---|---|---|---|---|---|---|---|---|
|  | layer (A) |  |  |  |  |  |  |  |
|  | Sample of layer (B) | B-1 | B-1 | B-2 | B-1 | B-2 | B-1 | none |
|  | Thickness of layer (B) | 40 μm | 40 μm | 50 μm | 40 μm | 50 μm | 40 μm | — |
|  | Sample of layer (C) | — | C-1 | C-2 | C-3 | C-4 | — | — |
|  | Thickness of layer (C) | — | 25 nm | 45 nm | 10 μm | 0.3 μm | — | — |
|  | Adhesion temperature | 120° C. | 120° C. | 150° C. | 120° C. | 150° C. | 120° C. | 150° C. |
|  | Cleaning liquid | D-1 | D-1 | D-1 | D-1 | D-1 | D-1 | — |
| Results | Adhesion | good | good | good | good | good | good | poor |
|  | Back surface grinding resistance | good | good | good | good | good | good | — |
|  | Heat resistance | good | good | good | good | good | good | — |
|  | Support separation ability | good | good | good | good | good | good | — |
|  | Cleaning removability | good | good | good | good | good | poor | — |

As shown in Table 1, Examples 1 to 5, which satisfy the requirements of the present invention, could perform a sequence of the processes up to cleaning the substrate. By contrast, Comparative Example 1, which did not use the thermoplastic resin layer (A), failed to separate the thermosetting resin layer (B) by treatment with the cleaning liquid (D). Moreover, Comparative Example 2, which did not use the thermosetting resin layer (B), failed in bonding, and thus the subsequent evaluations could not be performed.

It should be noted that the present invention is not limited to the above-described embodiments. The above-described embodiments are described for illustrative purposes, and those having substantially the same configuration and those providing the same operational advantage as the technical concept described in the claims of the present invention are all encompassed in the technical scope of the present invention.

The invention claimed is:

1. A wafer processing laminate comprising a support, a temporary adhesive material layer laminated on the support, and a wafer stacked on the temporary adhesive material layer, the wafer having a front surface on which a circuit is formed and a back surface to be processed, the temporary adhesive material layer comprising a first temporary adhesive layer composed of a thermoplastic resin layer (A) laminated on the front surface of the wafer, a second temporary adhesive layer composed of a thermosetting resin layer (B) laminated on the first temporary adhesive layer, and a third temporary adhesive layer composed of a separation layer (C) laminated between the support and the thermosetting resin layer (B), the thermoplastic resin layer (A) being soluble in a cleaning liquid (D) after processing the wafer, the thermosetting resin layer (B) being insoluble in the cleaning liquid (D) after heat curing and capable of absorbing the cleaning liquid (D) such that the cleaning liquid (D) permeates into the layer (B), the layer (C) having a peeling force of 0.5 gf or more and 50 gf or less which is required for peeling the thermosetting resin layer (B) along an interface between the thermosetting polymer layer (B) and the separation layer (C), or which is required for peeling the thermosetting polymer layer (B) with cohesion failure of the separation layer (C), when the polymer layer (B) laminated on the separation layer (C) on the support is thermally cured, as measured by 180° peeling using a test piece having a width of 25 mm.

2. The wafer processing laminate according to claim 1, wherein the separation layer (C) does not remain on the thermosetting resin layer (B) when the support is separated from the wafer processing laminate along the separation layer (C).

3. The wafer processing laminate according to claim 1, wherein when the support is separated from the wafer processing laminate along the separation layer (C), the separation layer (C) can partially or completely remain on the thermosetting resin layer (B), and the separation layer (C) is soluble in the cleaning liquid (D), or insoluble in the cleaning liquid (D) and capable of absorbing the cleaning liquid (D) such that the cleaning liquid (D) permeates into the layer (C).

4. The wafer processing laminate according to claim 1, wherein the thermoplastic resin layer (A) contains one or more of an aliphatic hydrocarbon resin and an aromatic hydrocarbon resin.

5. The wafer processing laminate according to claim 1, wherein the thermosetting resin layer (B) contains one or more of a silicone resin, an epoxy resin, a polyimide resin, an acrylic resin, and a phenol resin.

6. The wafer processing laminate according to claim 1, wherein the cleaning liquid (D) is one or more organic solvents selected from an aliphatic hydrocarbon solvent, an aromatic hydrocarbon solvent, a ketone solvent, an alcohol solvent, an ether solvent, an ester solvent, an amine solvent, an ammonium solvent, and an organic acid solvent, or a mixed solution containing the organic solvent and one or more liquids selected from a basic aqueous solution, an acidic aqueous solution, and water.

7. The wafer processing laminate according to claim 2, wherein the separation layer (C) contains one or more of a thermoplastic silicone material, a thermosetting silicone material, a fluorine material, an aliphatic hydrocarbon material, and an aromatic hydrocarbon material.

8. The wafer processing laminate according to claim 3, wherein the separation layer (C) contains one or more of a thermoplastic silicone material, a thermosetting silicone material, a fluorine material, an aliphatic hydrocarbon material, and an aromatic hydrocarbon material.

9. The wafer processing laminate according to claim 2, wherein one or more of adhesive strength between the support and the separation layer (C), adhesive strength between the thermosetting resin layer (B) and the separation layer (C), and cohesive failure strength of the separation layer (C) are lower than adhesive strength between the thermoplastic resin layer (A) and the thermosetting resin layer (B).

10. The wafer processing laminate according to claim 3, wherein one or more of adhesive strength between the support and the separation layer (C), adhesive strength between the thermosetting resin layer (B) and the separation layer (C), and cohesive failure strength of the separation layer (C) are lower than adhesive strength between the thermoplastic resin layer (A) and the thermosetting resin layer (B).

11. The wafer processing laminate according to claim 2, wherein one or more of adhesive strength between the support and the separation layer (C), adhesive strength between the thermosetting resin layer (B) and the separation layer (C), and cohesive failure strength of the separation layer (C) are decreased when the wafer processing laminate is plane-irradiated or laser-irradiated with X-rays, ultraviolet rays, visible rays, infrared rays, or light having wavelengths within a specific range.

12. The wafer processing laminate according to claim 3, wherein one or more of adhesive strength between the support and the separation layer (C), adhesive strength between the thermosetting resin layer (B) and the separation layer (C), and cohesive failure strength of the separation layer (C) are decreased when the wafer processing laminate is plane-irradiated or laser-irradiated with Xrays, ultraviolet rays, visible rays, infrared rays, or light having wavelengths within a specific range.

13. The wafer processing laminate according to claim 1, wherein the separation layer (C) contains one or more of a thermoplastic silicone material, a fluorine material, an aliphatic hydrocarbon material, and an aromatic hydrocarbon material.

14. The wafer processing laminate according to claim 1, wherein the separation layer (C) contains a thermosetting silicone material, and the thermosetting silicone material contains components (C1) to (C3) shown below:
   (C1) an organopolysiloxane having two or more alkenyl groups per molecule;
   (C2) an organohydrogenpolysiloxane having two or more silicon-bonded hydrogen atoms (Si—H groups) per molecule, in such an amount that a mole ratio of the Si—H group in the component (C2) to the alkenyl group in the component (C1) ranges from 0.3 to 10; and
   (C3) a platinum-based catalyst.

* * * * *